United States Patent
Grouwstra et al.

(10) Patent No.: US 9,329,491 B2
(45) Date of Patent: May 3, 2016

(54) METHOD OF ADJUSTING SPEED AND/OR ROUTING OF A TABLE MOVEMENT PLAN AND A LITHOGRAPHIC APPARATUS

(75) Inventors: Cédric Désiré Grouwstra, Eindhoven (NL); Nicolaas Rudolf Kemper, Eindhoven (NL); Norbertus Josephus Martinus Van Den Nieuwelaar, Tilburg (NL); Dirk De Vries, Eindhoven (NL); Hua Li, Eindhoven (NL); Marinus Jochemsen, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 864 days.

(21) Appl. No.: 13/168,177

(22) Filed: Jun. 24, 2011

(65) Prior Publication Data

US 2012/0003381 A1    Jan. 5, 2012

Related U.S. Application Data

(60) Provisional application No. 61/361,252, filed on Jul. 2, 2010, provisional application No. 61/377,725, filed on Aug. 27, 2010.

(51) Int. Cl.
*G03B 27/52* (2006.01)
*G03F 7/20* (2006.01)

(52) U.S. Cl.
CPC ........ *G03F 7/70341* (2013.01); *G03F 7/70725* (2013.01)

(58) Field of Classification Search
CPC .......................... G03F 7/70341; G03F 7/70725
USPC ............................................... 355/30, 40, 52
See application file for complete search history.

(56) References Cited

U.S. PATENT DOCUMENTS

| 4,509,852 A | 4/1985 | Tabarelli et al. |
| 2004/0136494 A1 | 7/2004 | Lof et al. |

(Continued)

FOREIGN PATENT DOCUMENTS

| CN | 1723538 | 1/2006 |
| CN | 101561639 | 10/2009 |

(Continued)

OTHER PUBLICATIONS

Fu-Jye Liang et al., "Immersion Defect Reduction (1)—Analysis of Water Leaks in an Immersion Scanner," Proc. of SPIE, vol. 6520, pp. 65204U-1-65204U-10 (2007).

(Continued)

*Primary Examiner* — Deoram Persaud
(74) *Attorney, Agent, or Firm* — Pillsbury Winthrop Shaw Pittman LLP

(57) ABSTRACT

A method of adjusting speed and/or routing of a part of a movement plan of a table under an immersion fluid supply system of a lithographic apparatus. The method includes splitting the movement plan of the table into a plurality of discrete movements; determining a risk of a bubble of a size greater than a certain size being present in immersion fluid through which a patterned beam of the lithographic apparatus will pass during a certain discrete movement by determining whether the immersion fluid supply system passes over a position at which immersion fluid leaked from the immersion fluid supply system is present; and adjusting the speed and/or routing of a part of the movement plan corresponding to (i) a discrete movement earlier than a discrete movement for which the risk of a bubble is determined, and/or (ii) a discrete movement for which the risk of a bubble is determined.

21 Claims, 16 Drawing Sheets

(56) References Cited

U.S. PATENT DOCUMENTS

| | | |
|---|---|---|
| 2004/0207824 A1 | 10/2004 | Lof et al. |
| 2005/0042554 A1* | 2/2005 | Dierichs et al. ..... G03F 7/70958 430/322 |
| 2006/0038968 A1 | 2/2006 | Kemper et al. |
| 2006/0119809 A1 | 6/2006 | Verhagen et al. |
| 2006/0126044 A1 | 6/2006 | Mizutani et al. |
| 2007/0188733 A1 | 8/2007 | Ito et al. |
| 2007/0285639 A1 | 12/2007 | Liang et al. |
| 2008/0068570 A1 | 3/2008 | Streefkerk et al. |
| 2008/0212046 A1 | 9/2008 | Riepen et al. |
| 2009/0126565 A1* | 5/2009 | Cooper ............... G03F 7/70858 95/28 |
| 2009/0134488 A1 | 5/2009 | Jansen et al. |
| 2009/0161089 A1 | 6/2009 | Leenders et al. |
| 2009/0262318 A1 | 10/2009 | Van Den Dungen et al. |
| 2009/0279060 A1 | 11/2009 | Direcks et al. |
| 2009/0279062 A1 | 11/2009 | Direcks et al. |
| 2009/0296065 A1 | 12/2009 | Cloin et al. |
| 2010/0143832 A1* | 6/2010 | Houben ................ G03F 7/707 430/30 |
| 2010/0214543 A1 | 8/2010 | Stavenga et al. |

FOREIGN PATENT DOCUMENTS

| | | |
|---|---|---|
| CN | 101598905 | 12/2009 |
| EP | 1 420 300 | 5/2004 |
| EP | 1 921 504 | 5/2008 |
| EP | 2 221 669 | 8/2010 |
| JP | 2006-147743 | 6/2006 |
| JP | 2007-194484 | 8/2007 |
| JP | 2008-300771 | 12/2008 |
| JP | 2009-260343 | 11/2009 |
| JP | 2010-109391 | 5/2010 |
| TW | 200928576 | 7/2009 |
| TW | 201022858 | 6/2010 |
| WO | 99/49504 | 9/1999 |
| WO | 2005/064405 | 7/2005 |

OTHER PUBLICATIONS

Lin-Hung Shiu et al., "Immersion Defect Reduction (2)—The Formation Mechanism and Reduction of Patterned Defects," Proc. of SPIE, vol. 6520, pp. 652012-1-652012-7 (2007).

* cited by examiner

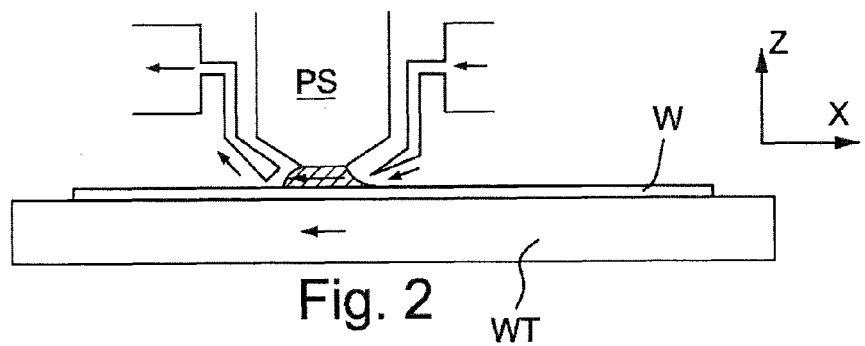
Fig. 2
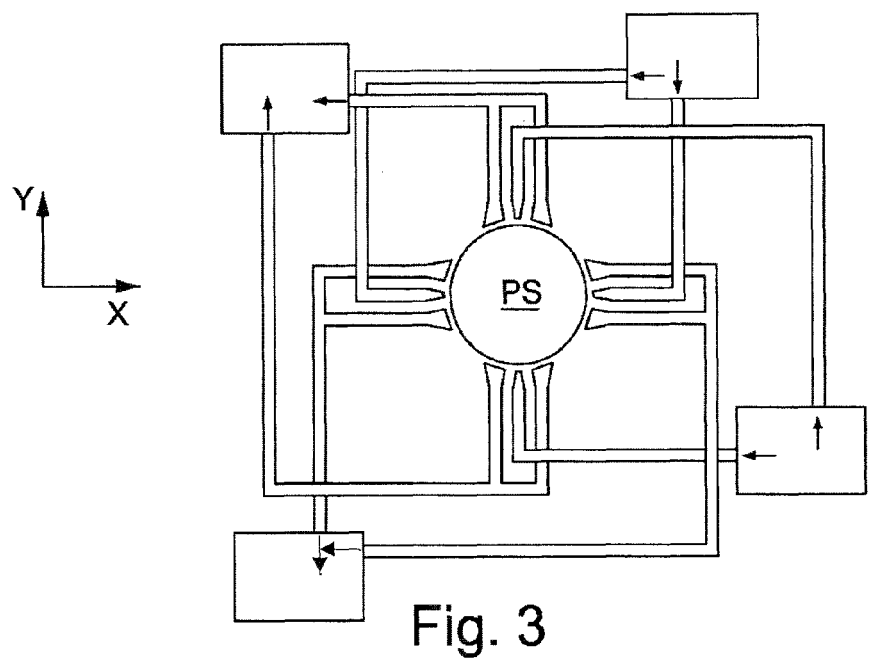
Fig. 3
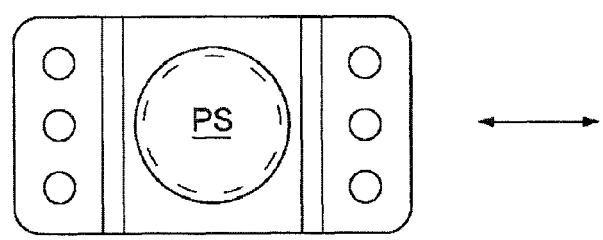
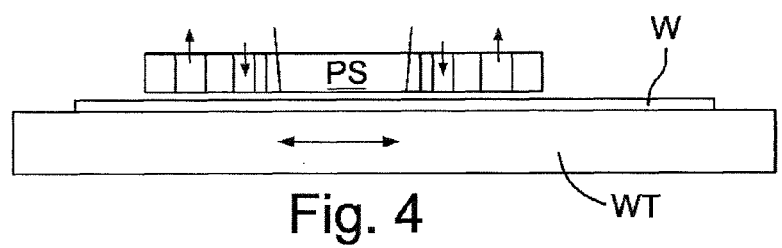
Fig. 4

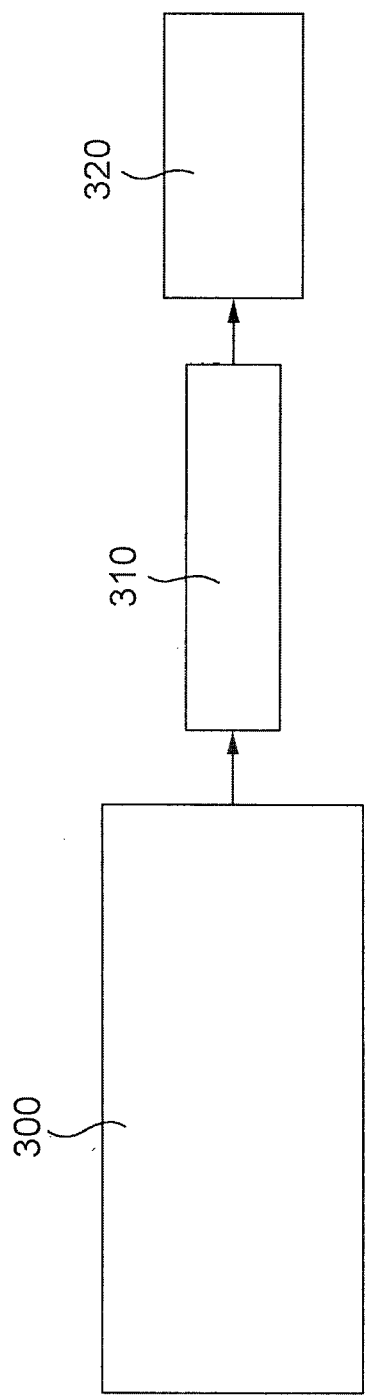

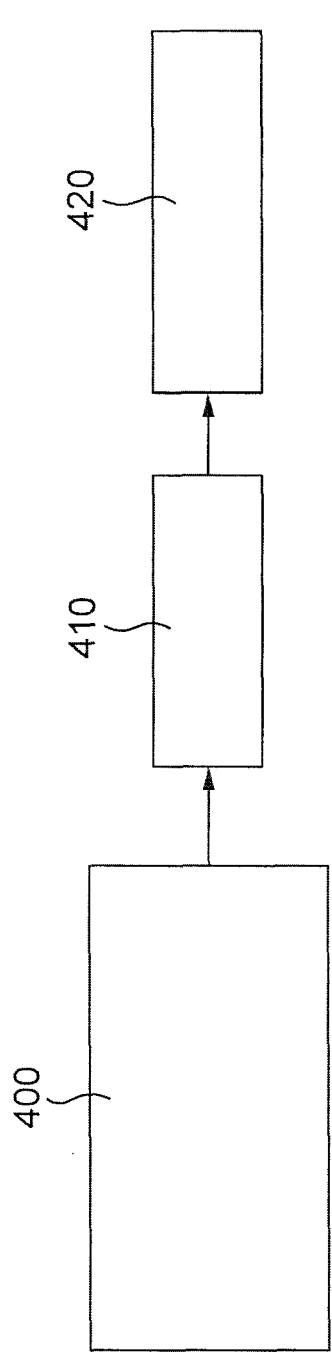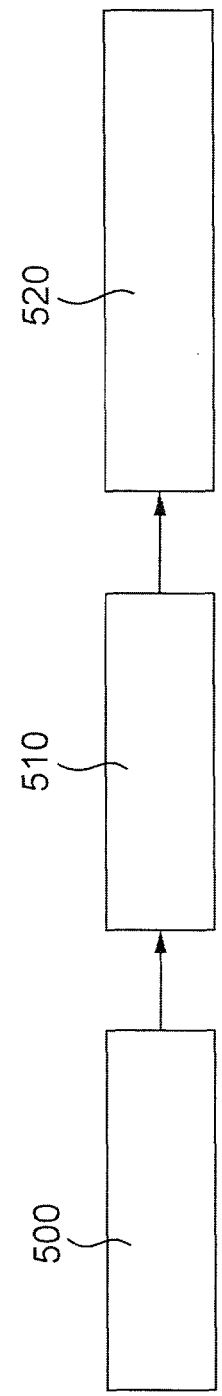

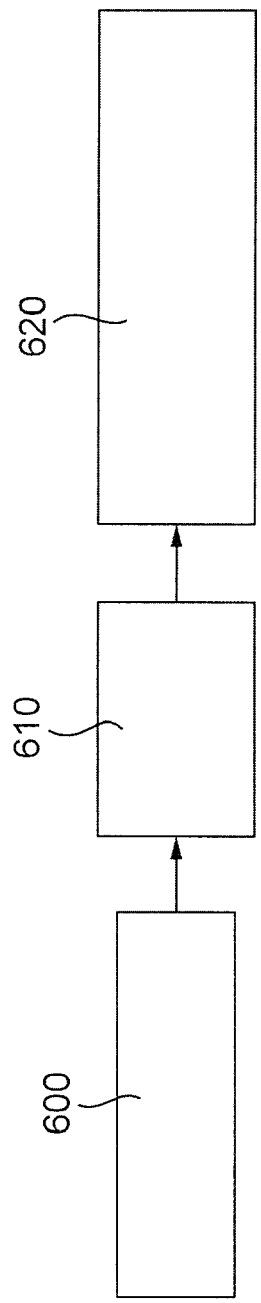
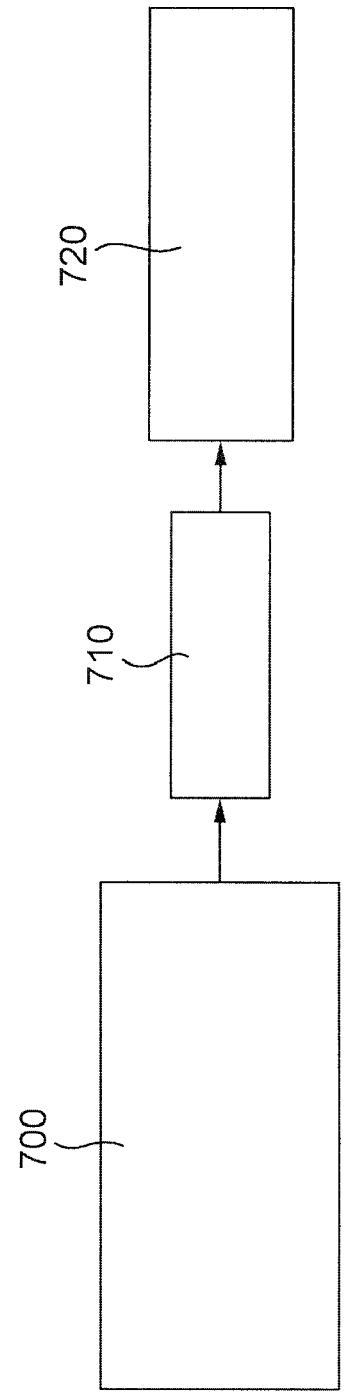

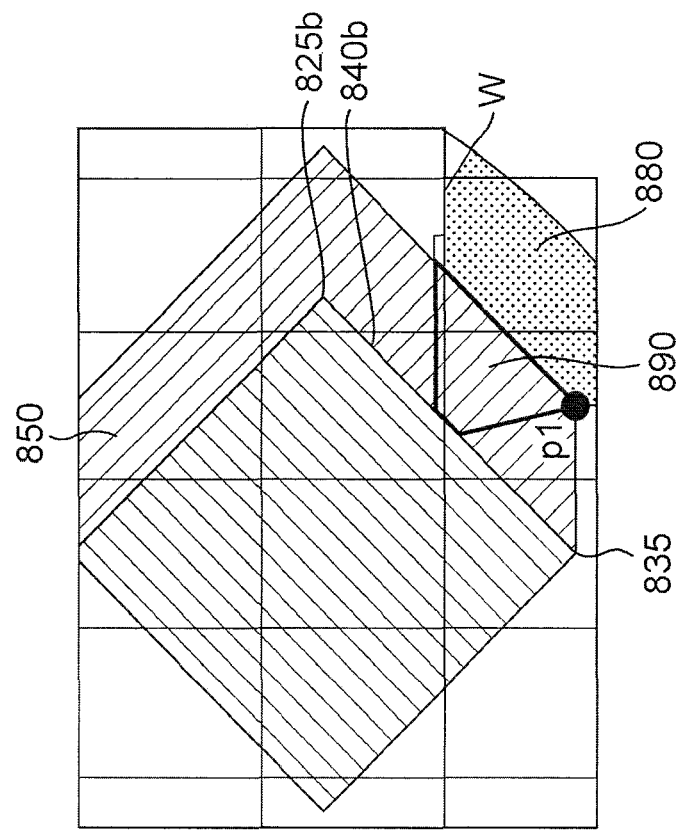
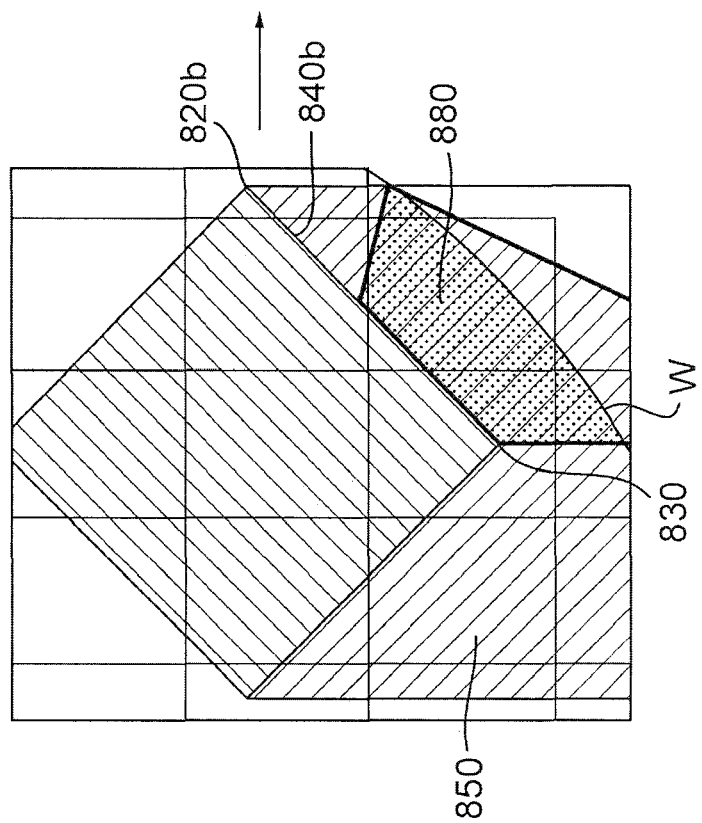
Fig. 16

METHOD OF ADJUSTING SPEED AND/OR ROUTING OF A TABLE MOVEMENT PLAN AND A LITHOGRAPHIC APPARATUS

This application claims priority and benefit under 35 U.S.C. §119(e) to U.S. Provisional Patent Application Ser. No. 61/361,252, entitled "A Method Of Adjusting Speed and/or Routing Of A Table Movement Plan and A Lithographic Apparatus", filed on Jul. 2, 2010, and to U.S. Provisional Patent Application Ser. No. 61/377,725, entitled "A Method Of Adjusting Speed and/or Routing Of A Table Movement Plan and A Lithographic Apparatus", filed on Aug. 27, 2010. The contents of those applications are incorporated herein in their entirety by reference.

FIELD

The present invention relates to a method of adjusting speed and/or routing of a movement plan of a table and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example U.S. Pat. No. 4,509,852) means that there is a large body of liquid that must be accelerated during a scanning exposure. This requires additional or more powerful motors and turbulence in the liquid may lead to undesirable and unpredictable effects.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, preferably along the direction of movement of the substrate relative to the final element, and is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and can be arranged in a plate with a hole in its center and through which the patterned beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

In European patent application publication no. EP 1420300 and United States patent application publication no. US 2004-0136494, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate W in all positions and which is arranged to have immersion liquid extending between it and the top surface of the substrate and/or substrate table which holds the substrate.

SUMMARY

In immersion lithography some liquid may be lost from the space onto a substrate being exposed. The lost liquid may pose a defectivity risk. A droplet of liquid present on the substrate which later collides with liquid in the space, for example the meniscus of the liquid, may cause the formation of a volume of gas, such as a bubble within the space. The bubble may interfere with imaging radiation directed towards a target portion of the substrate to affect the imaged pattern on the substrate.

It is desirable, for example, to reduce or eliminate the risk of such an imaging defect.

According to an aspect of the invention, there is provided a method of adjusting speed and/or routing of a part of a movement plan of a table under an immersion fluid supply system of a lithographic apparatus, the method comprising: a splitting step for splitting the movement plan of the table into a plurality of discrete movements; a risk determining step for determining for a certain of the plurality of discrete movements a risk of a bubble of a size greater than a certain size being present in immersion fluid of the immersion fluid supply system through which a patterned beam of the lithographic apparatus will pass during the certain discrete movement by determining whether the immersion fluid supply system passes over a position at which immersion fluid leaked from the immersion fluid supply system is present; and an adjusting step for (i) adjusting the speed and/or routing of a part of the movement plan corresponding to at least one discrete movement earlier than a discrete movement for which the risk determining step determines a risk of a bubble, and/or (ii) adjusting the speed and/or routing of a part of the movement plan corresponding to a discrete movement for which the risk determining step determines a risk of a bubble.

According to an aspect of the invention, there is provided an immersion lithographic apparatus comprising: a substrate table configured to support a substrate; a projection system configured to direct a patterned beam of radiation on to a substrate; a immersion fluid supply system configured to supply and confine immersion fluid to a space defined between the projection system and the substrate, or the substrate table, or both; a positioning system configured to determine the relative position of the substrate, or the substrate table, or both, relative to the immersion fluid supply system, or the projection system, or both; and a controller constructed and arranged to control a table according to a movement plan, wherein the controller is configured to adjust speed and/or routing of the movement plan by splitting the movement plan into a plurality of discrete movements, determining for a certain of the plurality of discrete movements a risk of a bubble of a size greater than a certain size being present in immersion fluid of the immersion fluid supply system through which a patterned beam of the lithographic apparatus will pass during the certain discrete movement by determining whether a position at which immersion fluid leaked from the immersion fluid supply system is present travels under the immersion fluid supply system, and adjusting (i) the speed and/or routing of a part of the movement plan corresponding to a discrete movement earlier than a discrete movement for which the determining determines a risk of a bubble, and/or (ii) the speed and/or routing of a part of the movement plan corresponding to a discrete movement for which the determining determines a risk of a bubble.

According to an aspect of the invention, there is provided a method of adjusting speed and/or routing of a part of a movement plan of a table under an immersion fluid supply system of a lithographic apparatus, the method comprising: splitting the movement plan of the table into a plurality of discrete movements; determining, for a certain discrete movement of the plurality of discrete movements, a risk of a bubble of a size greater than a certain size being present in immersion fluid of the immersion fluid supply system through which a patterned beam of the lithographic apparatus will pass during the certain discrete movement by determining whether a position at which immersion fluid leaked from the immersion fluid supply system is present travels under the immersion fluid supply system; and adjusting (i) the speed and/or routing of a part of the movement plan corresponding to a discrete movement earlier than a discrete movement for which the risk of a bubble is determined, and/or (ii) the speed and/or routing of a part of the movement plan corresponding to a discrete movement for which the risk of a bubble is determined.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts a further liquid supply system for use in a lithographic projection apparatus;

FIG. 8 illustrates the inputs and outputs used to split a movement plan of a table under a projection system of the lithographic apparatus of FIG. 1 into a plurality of discrete movements, according to an embodiment of the invention;

FIG. 9 illustrates the inputs and outputs used to determine, for a certain discrete movement, the position of fluid leaked from an immersion fluid supply system, according to an embodiment of the invention;

FIG. 10 illustrates the inputs and outputs of bubble risk and liquid risk calculations, according to an embodiment of the invention;

FIG. 11 illustrates the inputs and outputs of the scan and step speed converter, according to an embodiment of the invention;

FIG. 12 illustrates the inputs and outputs of a method to predict TIS liquid loss, according to an embodiment of the invention;

FIG. 16 illustrates how secondary liquid loss may occur;

DETAILED DESCRIPTION

Figure 1:
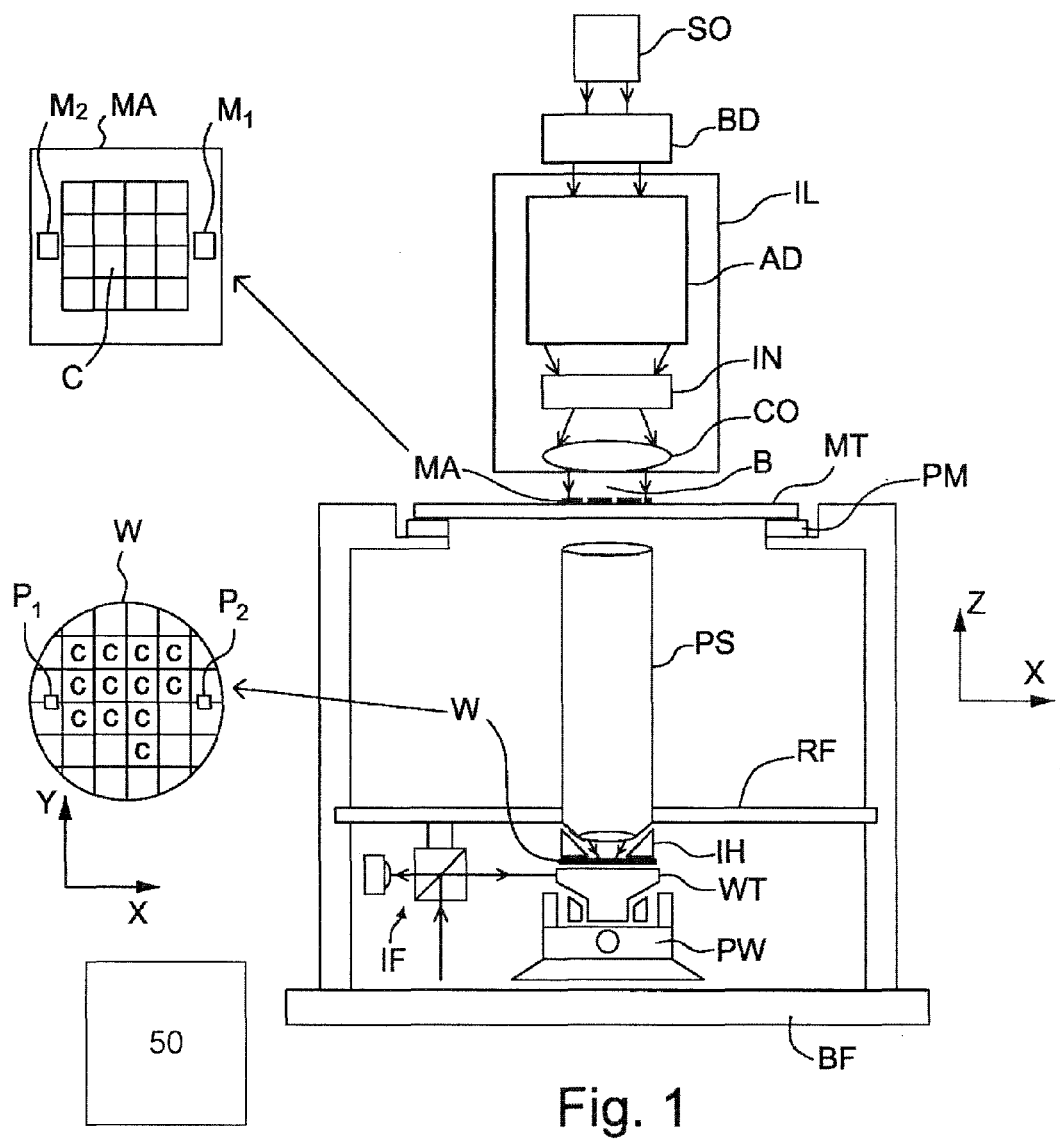
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or DUV radiation); a support structure (e.g. a mask table) MT constructed to support a patterning device (e.g. a mask) MA and connected to a first positioner PM configured to accurately position the patterning device in accordance with certain parameters; a substrate, table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS (supported by a frame) configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks) Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into two general categories. These are the bath type arrangement in which the whole of the substrate W and optionally part of the substrate table WT is submersed in a bath of liquid and the so called localized immersion system which uses a liquid supply system in which liquid is only provided to a localized area of the substrate. In the latter category, the space filled by liquid is smaller in plan than the top surface of the substrate and the area filled with liquid remains substantially stationary relative to the projection system PS while the substrate W moves underneath that area. A further arrangement, to which an embodiment of the present invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 were described above.

Figure 5:
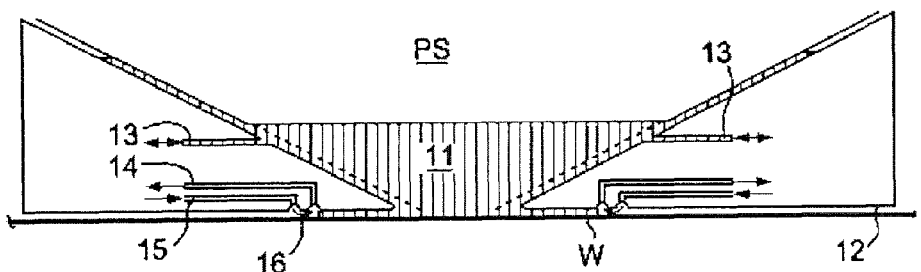
FIG. 5 depicts, in cross-section, a barrier member which may be used in an embodiment of the present invention as an immersion liquid supply system.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824.

FIG. 5 schematically depicts a localized liquid supply system with a barrier member 12, IH. The barrier member extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The barrier member 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a fluid seal, desirably a gas seal.

The barrier member 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the barrier member 12 positioned below and surrounding the final element of the projection system PS. Liquid is brought into the space below the projection system and within the barrier member 12 by liquid inlet 13. The liquid may be removed by liquid outlet 13. The barrier member 12 may extend a little above the final element of the projection system. The liquid level rises above the final element so that a buffer of liquid is provided. In an embodiment, the barrier member 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

The example of FIG. 5 is a so called localized area arrangement in which liquid is only provided to a localized area of the top surface of the substrate W at any one time. Other arrangements are possible, including fluid handling systems which make use of a single phase extractor or a two phase extractor as disclosed, for example, in United States patent application publication no US 2006-0038968. In an embodiment, a single or two phase extractor may comprise an inlet which is covered in a porous material. In an embodiment of a single phase extractor the porous material is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 300 μm, desirably 5 to 50 μm. In an embodiment, the porous material is at least slightly liquidphilic (e.g., hydrophilic), i.e. having a contact angle of less than 90° to the immersion liquid, e.g. water.

Another arrangement which is possible is one which works on a gas drag principle. The so-called gas drag principle has been described, for example, in United States patent application publication nos. US 2008-0212046, US 2009-0279060 and US 2009-0279062. In that system the extraction holes are arranged in a shape which desirably has a corner. The corner may be aligned with the stepping or scanning directions. This reduces the force on the meniscus between two openings in the surface of the fluid handing structure for a given speed in the step or scan direction compared to if the two outlets were aligned perpendicular to the direction of scan.

Also disclosed in US 2008-0212046 is a gas knife positioned radially outside the main liquid retrieval feature. The gas knife traps liquid which gets past the main liquid retrieval feature. Such a gas knife may be present in a so called gas drag principle arrangement (as disclosed in US 2008-0212046), in a single or two phase extractor arrangement (such as disclosed in United States patent application publication no. US 2009-0262318) or any other arrangement.

Many other types of liquid supply system are possible. The present invention is not limited to any particular type of liquid supply system. As will be clear from the description below, an embodiment of the present invention may use any type of localized liquid supply system. An embodiment of the invention is particularly relevant to use with any localized liquid supply system as the liquid supply system.

In an immersion system, such as a confined immersion system, immersion liquid may escape from the liquid confinement structure 12. The escaped liquid may settle on a surface of the substrate table or the substrate being imaged. The escaped liquid may be in the form of a droplet or a film (hereinafter droplet refers to one or more droplets and/or film). The droplet may be the cause of one or more defectivity problems.

The position of the droplet on the substrate W or substrate table WT may pass under the liquid confinement structure 12. A defectivity problem may be caused by the collision of the droplet with the confined liquid. For example, in a confined immersion system, the droplet may collide with the liquid meniscus which extends between the liquid confinement structure 12 and the substrate W. Such a collision may cause liquid to enclose gas (e.g., air) as a bubble, which may be, for example, 5-10 μm in diameter but may be 1-500 μm in diameter. The bubble size may be typically between 5 and 10 microns. The bubble may move through the immersion liquid into the space 11 between the projection system PS and the substrate W or the bubble may be stationary on the substrate W and be moved into the space 11 by relative motion of the substrate W relative to the space 11. A bubble present at this location may affect imaging, i.e. the bubble may be exposed into the resist causing an imaging defect.

The risk of escaping liquid increases when an edge of a substrate W moves under the liquid confinement structure 12, for example after imaging a line of dies which cross the substrate or at the beginning of imaging a line of dies. In crossing the substrate edge, the substrate edge and substrate table WT move under the liquid confinement structure 12 so that the immersion space 11 is defined by the substrate table WT surface instead of the substrate W surface. In moving the substrate W from under the projection system PS to be replaced by the substrate table WT, the gap passes under the projection system PS. This can cause the meniscus to lose stability. As a result liquid may escape.

United States patent application publication no. US 2010-0214543, discloses a method in which all substrate movements when imaging around the edge of the substrate are slowed down to try to prevent imaging errors occurring due to big bubbles in the space 11.

An embodiment of the invention involves predicting a boundary of an area within which a bubble on a substrate before exposure could be expected. If such an area is predicted, a change to a movement plan of a table under an immersion fluid supply system in a lithographic apparatus can be made. The change may include adjusting the speed and/or routing of part of the movement plan of the table under the immersion fluid supply system.

Figure 6:
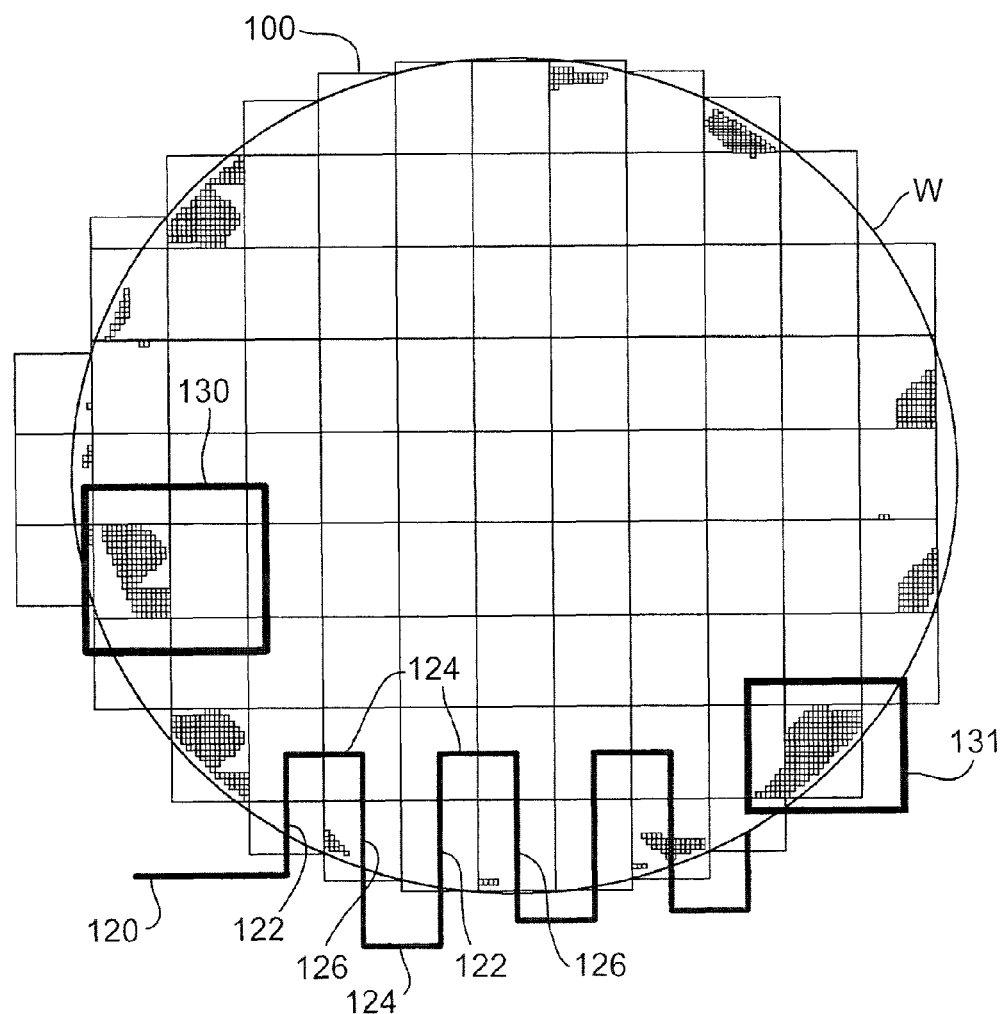
FIG. 6 is a schematic illustration of a substrate, in plan, with the position of defects predicted by an embodiment of the invention indicated.

Using the lay-out of the fields and scan direction of the exposures, substrate table WT move characteristics and immersion fluid supply system dimensions, the moves of the substrate WT under the immersion fluid supply system may be simulated. That is, the change in position of the substrate table under the immersion fluid supply system with time may be simulated. Using a liquid loss prediction algorithm for each step and scan movement involving film pulling and defect formation effects, optimal speed and routing may be determined for each exposure (taking into account resist characteristics), e.g., avoiding defectivity issues and unnecessary throughput hits. FIG. 6 is a picture of predicted defects.

An embodiment of the method includes three main steps, namely a splitting step, a risk determining step and an adjusting step.

During the splitting step, the movement plan of the substrate table WT is split into a plurality of discrete movements. FIG. 6 shows, in plan, a substrate W with each exposure field 100 superimposed on top of the substrate W. A path 120 of the substrate table WT under the immersion fluid supply system is illustrated. The path includes up and down scan movements 122, 126 respectively and step movements 124. During the up and down scan movements 122, 126 adjacent fields 100 for example, are imaged. During the splitting step, the movement plan 120 is split into individual scan 122, 126 and step movements 124, i.e. a plurality of discrete movements.

For each of these discrete stepping movements 124 and scanning movements 122, 126, a risk determining step is carried out. Part of the risk determining step is to determine the risk of a bubble being present in immersion fluid, i.e. is an area of bubble risk determined. In particular, the risk of a bubble of a size greater than a certain size being present in immersion fluid of the immersion fluid supply system through which a patterned beam B of the lithographic apparatus will pass during the movement is assessed. In an embodiment, to calculate this risk it is assumed that a risk of a bubble of a size greater than a certain size will be present if the immersion fluid supply system becomes located over (e.g., by movement of the liquid supply system itself, by movement of the substrate, or both) a position at which immersion fluid leaked from the immersion fluid supply system is present. In an embodiment, "the immersion fluid supply system becomes located over the position" means the bulk liquid contained by the immersion fluid supply system, such as the meniscus extending between the liquid supply system and a facing surface, such a substrate or substrate table.

Therefore, during the risk determining step a sub-routine is followed in which liquid loss is predicted using a liquid loss prediction algorithm. The position of any liquid loss predicted by the liquid loss prediction algorithm is stored. If it is calculated that the immersion fluid supply system would become located over a position at which leaked immersion fluid is present, it is determined that a risk of a bubble of a size greater than a certain size being present in immersion fluid in the immersion fluid supply system is high. Other methods of calculating the risk of a bubble being present, for example a physical model, may be used. The model described below is an empirical model; a simplification of reality. Below an empirical model that uses rules based on practical observations to predict accurately the risk of bubbles is described. A more physical model would use, for example, a model of the physical behavior of the liquid based on equations derived from properties of the liquid and surfaces. Such a model would need inputs like substrate properties (e.g. contact angle, de-wetting speed).

If the risk determining step determines that the risk of a bubble of a size greater than the certain size being present in immersion fluid of the immersion fluid supply system through which a patterned beam of the lithographic apparatus will pass during a movement is high, an adjusting step will take place.

During the adjusting step any action which would result in reducing or eliminating the risk of the bubble determined in the risk determining step can be taken. In an embodiment the speed of the discrete movement for which the risk determining step determines there is a risk of a bubble is adjusted. In an embodiment only scan movements 122, 126 over exposure fields are adjusted. Adjusting the speed by slowing it down can reduce the risk of a bubble being included into immersion fluid of the immersion fluid supply system. This works because the velocity of a collision of a meniscus extending between the immersion fluid supply system and the substrate and a droplet of liquid on the substrate (predicted to have leaked from the immersion fluid supply system during a previous movement) is reduced. At reduced velocity the chance of the collision including a bubble in the immersion liquid is reduced.

Alternatively or additionally, the routing of the movement for which the risk of a bubble has been predicted by the risk determining step can be changed to avoid collision with liquid on the substrate.

Alternatively or additionally, the speed of a part of the movement plan corresponding to a movement earlier than the movement for which the risk determining step determines a risk of a bubble may be adjusted. In one embodiment, the magnitude of the adjustment (reduction) of the speed can be determined based upon the angle between the edge of the substrate W and the meniscus extending between the immersion fluid supply system and the substrate. The lower the angle, the greater the reduction in speed. In this way the leaking of fluid from the immersion fluid supply system may be prevented so that there is substantially no liquid on the substrate during the movement for which the risk determining step determined a risk of a bubble.

Alternatively or additionally, the routing of the movement plan earlier than the movement for which a risk of a bubble has been determined could be varied, such that liquid left behind is not left in a position which could result in collision with the meniscus of the immersion fluid supply system and thereby result in a bubble.

Adjusting the routing of the part of the movement plan corresponding to at least one discrete movement earlier than a discrete movement for which the risk determining step determines a risk of a bubble could include changing the exposure direction and/or sequence of exposure of the fields 100 in the movement plan. Adjusting the routing of a part of the movement plan corresponding to a discrete movement for which the risk determining step determines a risk of a bubble could include changing the exposure direction and/or sequence of exposure of the fields 100 in the movement plan.

The scope of the simulation covers the entire substrate W rather than a single exposure field 100 to enable adequate prediction of defects caused by moves in the context of different exposures. After determination, by the method, of optimal speed and routing settings, the actual exposures are executed accordingly. Embodiments of the invention may be able to cover all customer situations.

Another potential benefit of using a prediction model is the possible gain in throughput (see table below showing the number of fields 100 that may be slowed down using a method and apparatus according to an embodiment of the present invention vs. methods and apparatuses described in U.S. patent application publication no. US 2010-0214543 for exposure layout). The real numbers may change in time due to changes in the model. In summary, the methods and apparatuses described in U.S. patent application publication no. US 2010-0214543 may have too many slowed down fields 100.

|  | Predicted & needed | | Predicted & not needed | | Bubbles present even after application of method | | Sum | | Total # Fields |
| --- | --- | --- | --- | --- | --- | --- | --- | --- | --- |
|  | scan | step | scan | step | Scan | Step | scan | step |  |
| US 2010-0214543 | 7 | 1 | 17 | 3 | 0 | 3 | 24 | 4 | 91 |
| present model | 7 | 4 | 4 | 3 | 0 | 0 | 11 | 7 | 91 |

Bubbles are a challenge for immersion systems. Liquid loss and subsequent collision with the meniscus extending between the immersion fluid supply system and the substrate W and/or substrate table WT (hereinafter referred to as the immersion fluid supply system meniscus) with a droplet tends to be the root cause. A method according to an embodiment of the invention uses a liquid loss prediction model which forms part of the risk determining step with exposure layout (e.g. pattern of exposure fields 100) and proposed simplified movement plan as input.

The model steps through the movement plan (sometimes called meander). Immersion fluid loss from the immersion fluid supply system is simulated to occur when the edge of a substrate W is passed as part of the risk determining step. The risk of a bubble is determined in the risk determining step by finding the fields 100 which have leaked immersion fluid on them prior to their exposure in the movement plan. The involved step/scan movement determined to be the cause of the immersion fluid loss can be slowed down to reduce or avoid immersion fluid loss and therefore the formation of a bubble. Alternatively the involved step/scan movement determined to have a risk of a bubble can be slowed down to reduce or avoid the formation of a bubble on collision of the immersion fluid supply system meniscus with the droplet. The model can be used to slow down all movements which are predicted to result in immersion fluid being left on the substrate W at the end of exposure of the substrate. This can be used to reduce or avoid liquid drying stains or liquid marks being left on the substrate. During imaging of a transmission image sensor (TIS) marker, a similar method can be used to avoid a droplet being left behind on that marker thereby to avoid misleading readings being made from that marker.

FIG. 6 illustrates in the shaded areas where it is predicted that there is a risk of a bubble without corrective action being taken. For area 130 the bubble risk is created during a scan up the field in which there is a risk of a bubble. The solution to this could be to reduce the speed of that particular scan movement. Alternatively or additionally, the movement resulting in liquid being left behind on the field could be slowed down. An additional or alternative option would be to change the routing of the movement plan to avoid scanning of that field while it has liquid on it. Also, for area 131, the bubble risk is created during a step movement and the solution could be to reduce the speed of the step movement.

Figure 7:
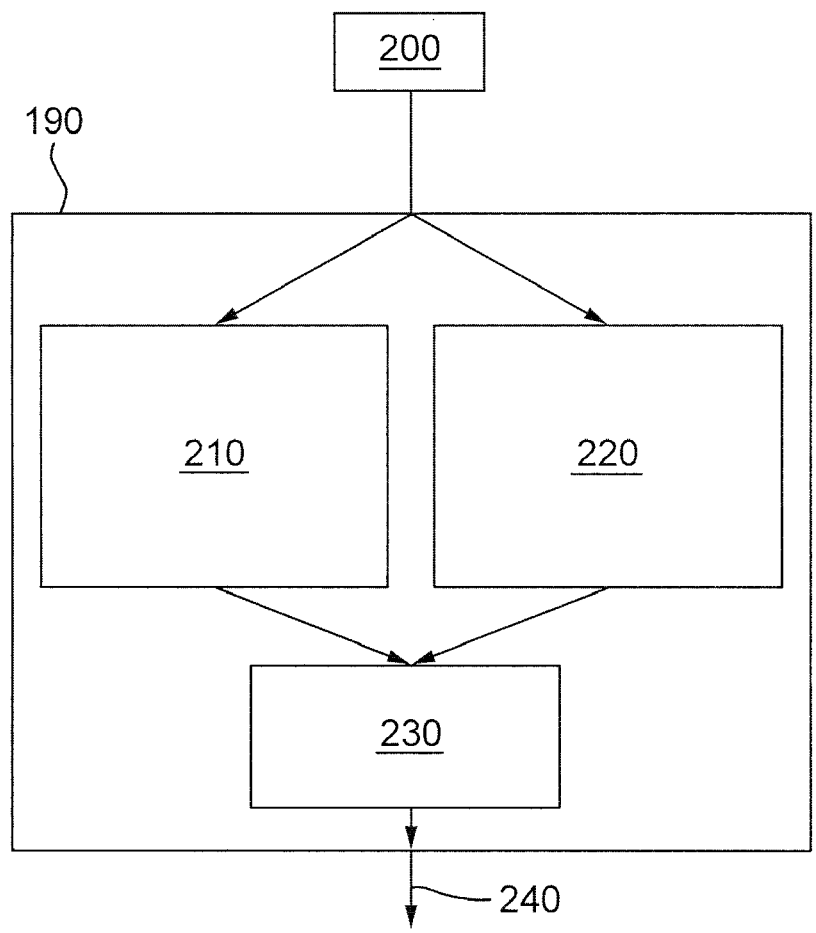
FIG. 7 represents a logic module of an embodiment of the invention.

The logic module 190 according to an embodiment of the invention is represented by FIG. 7. At 200 inputs are given to the logic module 190. The inputs may include machine constants such as the type of scan (e.g., so called Manhattan/diagonal), the scan coordinates (X, Y coordinates) and sequence (the exposure order of the coordinates), the scan parameters (v (velocity), a (acceleration), j (jerk) and Tsettle, described below), the dimensions of the immersion fluid supply system and any necessary further machine constants. These inputs are passed to the model 210 and to the manual override module 220. The outputs from the model 210 and the manual override module 220 are provided to a speed selector 230 which makes any necessary adjustments to the movement plan before outputting a movement plan at 240 which includes the necessary parameters of the modified movement plan.

The model 210 or method according to an embodiment of the invention may generally be explained in the following general sections:
1. Extension length & simplified trace creation which forms part of the splitting step for splitting the movement plan of the table into a plurality of discrete movements.
2. Model liquid loss which forms part of the risk determining step and determines whether or not a given movement will result in liquid being left behind on the substrate at the end of the movement.
3. Bubble risk (BR) & liquid risk (LR) determination which is part of the risk determining step and which determines based on the results of the extension length and simplified trace and model liquid loss steps whether or not there is a risk of a bubble.

The output from the model 210 and any overrides indicated manually by the user using the manual override module 220 are passed to the speed selector 230 which performs the adjusting step. The output of the speed selector 230 is then effectively a modified movement plan in which the risk of a bubble being produced in immersion fluid of the immersion fluid supply system through which a patterned beam of the lithographic apparatus will pass during illumination of the substrate has been reduced.

Figure 13:
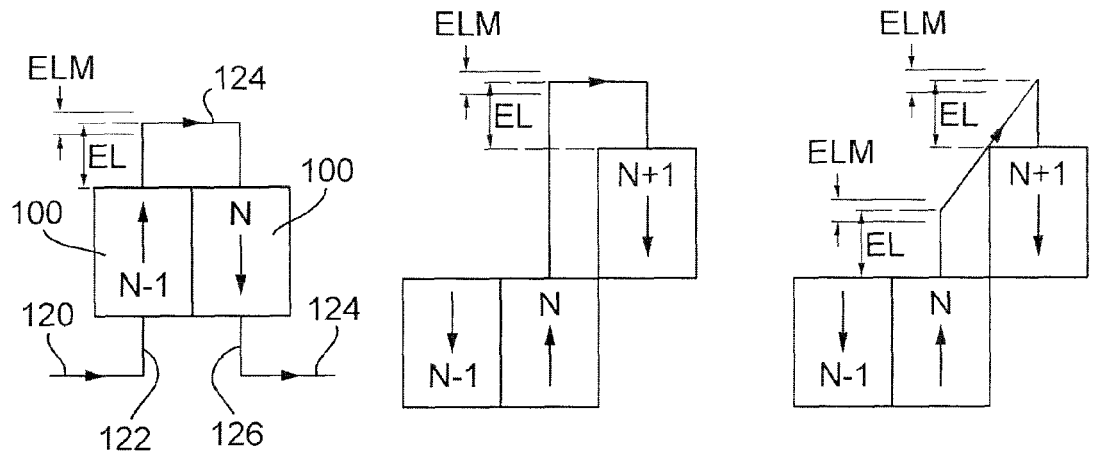
FIG. 13 gives detailed examples of a simplified meander, Manhattan, and diagonal movements.

Based on the scan-coordinates, -sequence and -parameters, a simplified movement plan may be created. The extension length is the distance from the end of the exposure scan field to the start of next step move, as discussed below. In one embodiment the method calculates this for fields N=1 to Nmax, creating a simplified movement plan of the real exposure routing. It is a simplification as it makes the real (continuous) movement discrete and assumes rectangular movements only. In FIG. 8, the inputs and outputs of the splitting step are shown. The inputs 300 are the scan coordinates (X, Y coordinates) and sequence (the exposure order of the coordinates), the scan and step speeds (v), the acceleration (a), the jerk (j) (rate of change of acceleration) and Tsettle. Tsettle in the scan parameters is a distance where the machine moves at a stable speed. Other inputs include whether the scan is Manhattan or diagonal and image shift. Manhattan is a rectangular movement first in vertical direction then in horizontal direction or vice versa, for example as shown in FIG. 13. Diagonal is a movement in a diagonal direction from one exposure field to another exposure field as shown in the right-hand picture of FIG. 13. An image shift in x is needed as input in case the image selection on patterning device level is asymmetric. At 310 the splitting step occurs and at 320 the plurality of discrete movements are output.

Based on the simplified meander from the scheme of FIG. 8, scan-coordinates, -sequence and the immersion fluid supply system dimensions, the BR (bubble risk) and LR (liquid risk) for each step and scan in the movement plan is calculated in the liquid loss model.

In FIG. 9, the inputs and outputs of the liquid loss model are shown. Input into the model at 400 is the output 320 of a simplified meander, that is the plurality of discrete movements, including the coordinates, speed and sequence. Other inputs are the dimensions of the immersion fluid supply system, the phi_UWA (defined below) and position of the edge of the recess in the substrate table in which the substrate lies. In

410 liquid loss is modeled. Liquid loss can be modeled in any way. One way of modeling liquid loss is described with reference to FIGS. 18 and 19 below. The output 420 is a position of any liquid which is deemed to have leaked from the immersion fluid supply system. The tasks within the model are further explained below.

The bubble risk (BR) and liquid risk (LR) determination is based on the relative size of the bubble substrate area of a specific move with respect to the total bubble substrate area size. In FIG. 10, the inputs and outputs of the bubble risk and liquid risk calculation model are shown.

In the scan and step speed converter illustrated in FIG. 10, the input at 500 is the output 420 of FIG. 9. The bubble risk and liquid risk is calculated at 510 and the output at 520 is the calculated bubble risk and liquid risk for each discrete movement. The alternative speed for an identified discrete movement in order to reduce the risk of a bubble being included is determined on the basis of the bubble risk and liquid risk. This is be done by converting bubble risk (BR)/liquid risk (LR) to an alternative speed, as shown in FIG. 11. The input 600 is the output 520 of FIG. 10. At 610 the alternative speed (in an alternative embodiment and/or the alternative routing) is calculated. At 620 an alternative speed (and in one embodiment and/or routing) for each discrete movement (scan/step) of the movement plan is outputted. This can be stored for use later. The tasks within the model are further explained below.

Liquid loss on markers/sensors (e.g., TIS markers/sensors) due to the movement plan can be predicted and movements slowed down/routing adjusted in accordance with embodiments of the present invention for improved scanner reliability. Inputs and outputs of the model are shown in FIG. 12. The input 700 is the same as at 400 illustrated in FIG. 9 except that phi_UWA and the margins outside the liquid radius are not needed. Instead, the marker/sensor coordinates on the substrate table are provided. The liquid loss is modeled at 710 and an output is provided at 720 which is similar to the output at 620. Thus, the liquid loss model 710 comprises many of the steps illustrated in FIGS. 9-11 corresponding to the liquid loss model on the substrate. The actions within the model are further explained below.

The tasks within the model are described below.

The extension length (EL) is illustrated in FIG. 13. The simplified movement plan creation of FIG. 8 automatically calculates the extension length (EL) based on the scan parameters or sets the extension length manually.

1. automatically—calculate by (worst case) formula [DEFAULT]:
   $EL=v*((a/2*j)+(v/2*a)+Tsettle)+0.5*(slit size)$ where v is the velocity, j is the jerk, a is the acceleration, Tsettle is the time for settling, and the slit size is the size of the exposure slit.
2. manual—specify a value for EL The extension length margins (ELM illustrated in FIG. 13) are specified by a machine constant (MC) and; specify a value to be added/subtracted from the calculated value of the extension by the EL. Parameters for extension length EL should be implemented in MCs.

Based on the extension length (EL) and the exposure layout, the simplified movement plan is created, like shown in FIG. 13 and with the following definitions:
   N=total number of steps+scans=(number of fields of exposure layout*2)−1
   Scan=("Start-scan"−EL−margin) to ("End-scan"+EL+margin)
   Step="End previous scan" to "start current scan"
In this section, the liquid loss model is described via a decision tree.

Figure 14:
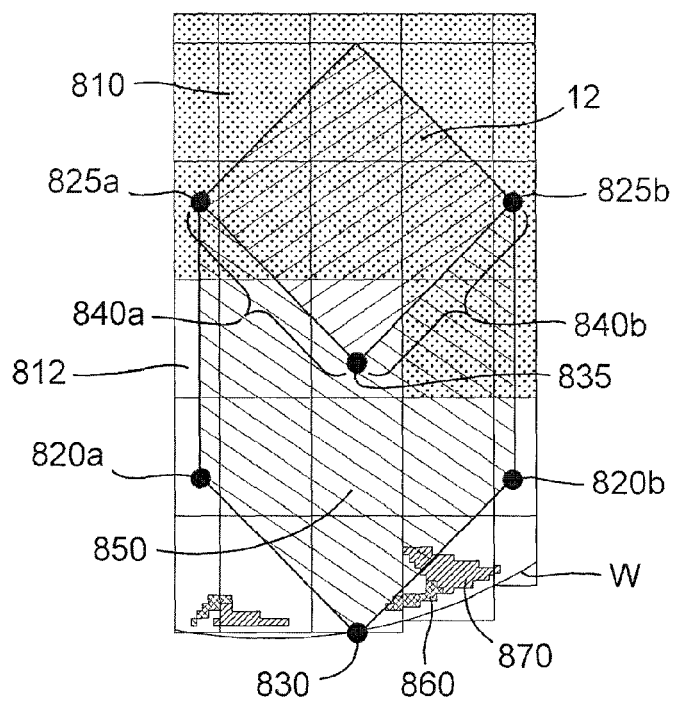
FIG. 14 shows general definitions used for the method to predict liquid loss.

The definitions of the used variables in the liquid loss model are explained below. In FIG. 14, the general model definitions are explained, while FIG. 15 explains how the uncontrolled wet area is defined. The examples in FIG. 14 are from scan moves (vertical). In a step move, everything will be rotated by 90 degrees.

Unexposed fields 810 in FIG. 14 are fields 100 from the substrate layout (see FIG. 6) which are not predicted yet by the model.

Exposed fields 812 in FIG. 14 are fields from the substrate layout which have already been predicted by the model (i.e. are downstream of the discrete movement currently being calculated).

Sidepoint start 820 in FIG. 14 is a sidepoint of the immersion fluid supply system (e.g. a side corner of the immersion fluid supply system that is, in plan, a four cornered shape) perpendicular to the immersion fluid supply system move direction at the start position of discrete movement. There are two of these positions on each side of the immersion fluid supply system. The positions are marked 820a, 820b.

Sidepoint end 825 in FIG. 14 is a sidepoint of the immersion fluid supply system perpendicular to immersion fluid supply system move direction at the end position of discrete movement. There are two of these positions on each side of the immersion fluid supply system. The positions are marked 825a, 825b.

Backpoint start 830 in FIG. 14 is the position of immersion fluid supply system corner at a trailing corner of the immersion fluid supply system at the start position of a discrete movement.

Backpoint end 835 in FIG. 14 is the position of the immersion fluid supply system trailing corner at the end position of a discrete movement.

Segment 840 in FIG. 14 is an immersion fluid supply system side from backpoint to sidepoints. There are two segments marked 840a and 840b.

Immersion fluid supply system footprint 12 in FIG. 14 is the position covered by the immersion fluid supply system at end of a discrete movement and shown as the diagonally hatched area. In an embodiment, the footprint 12 may be the outer boundary of a liquid confinement structure or may be some other position within the outer boundary (e.g., a location of a meniscus of liquid around the exposure field).

Immersion fluid supply system wet move 850 in FIG. 14 is the area over which a meniscus extending between the immersion fluid supply system and the substrate passes during the discrete movement shown as the diagonally cross hatched area.

Predicted liquid loss area 860 in FIG. 14 is the area on the substrate containing immersion fluid at the end of the discrete movement as predicted by the model.

Predicted bubble (BB) area 870 in FIG. 14 is the area on the substrate containing bubbles (BB) as predicted by the model.

Figure 15:
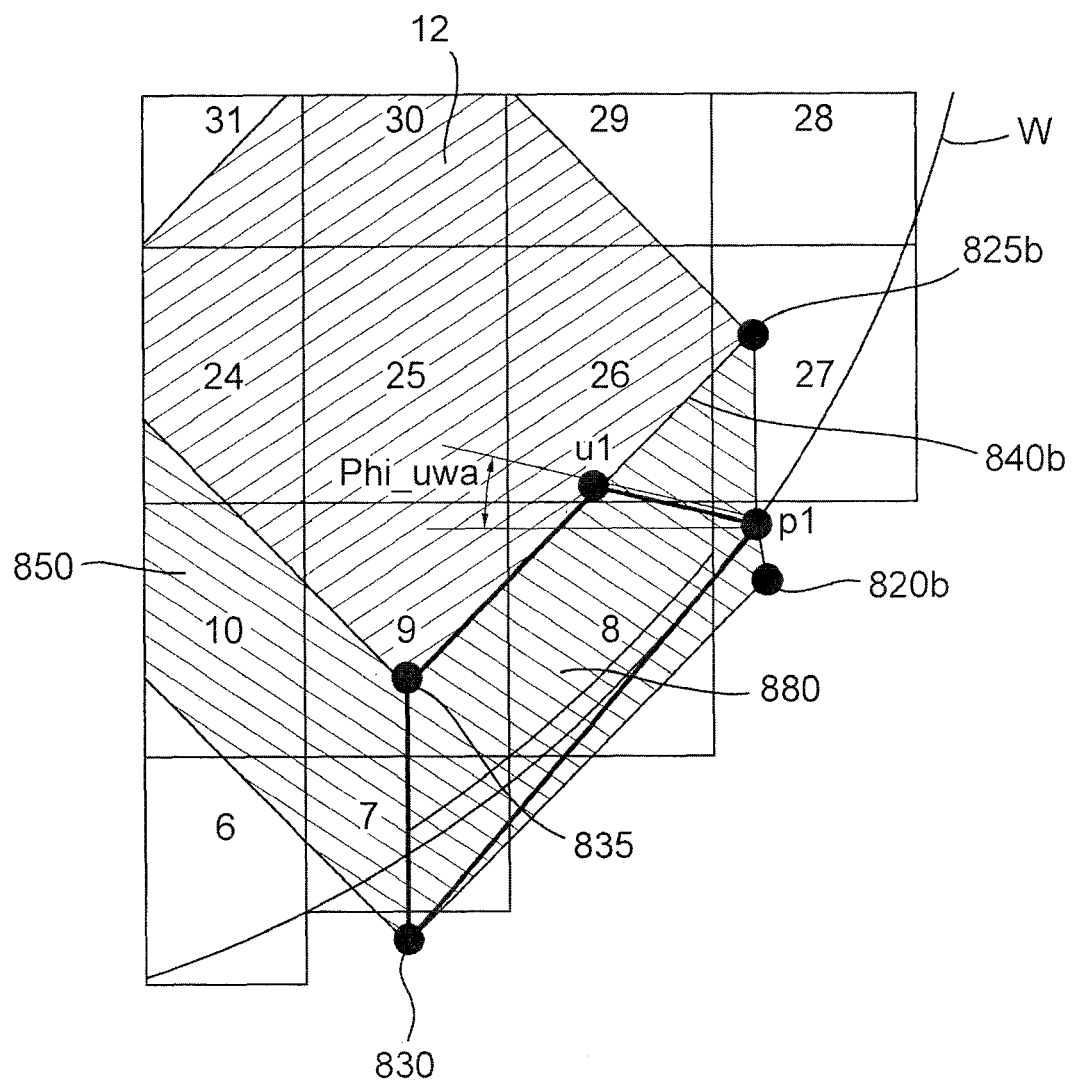
FIG. 15 illustrates definitions used to calculate uncontrolled liquid loss area (i.e. leaking immersion fluid)

Referring to FIG. 15, P1 in FIG. 15 is the position at which the substrate edge is crossed by the vector "sidepoint start (820b)"-"sidepoint end (825b)".

Phi_UWA is the angle which determines the immersion fluid loss area, which may be a fixed value in the model; alternatively the model can be based on a phi_UWA that is calculated by the model itself.

u1 in FIG. 15 is the crossing point of a line projected from p1 with angle phi_UWA and the immersion fluid supply system side (segment 840b) at the end position of the immersion fluid supply system.

UWA 880 in FIG. 15 is the uncontrolled wet area which is determined by the polygon defined by corners: backpoint start 830-backpoint end 835-u1-p1.

The above rules are followed unless one or more exceptions are present. Exceptions include: If p1 is outside the substrate: p1=sidepoint end 825a, 825b. If vector sidepoint start 820b-sidepoint end 825b is outside substrate W: p1=sidepoint end 825b. If vector sidepoint start 820b-sidepoint end 825b is inside substrate W: p1=substrate edge crossing point of the vector backpoint start 830-sidepoint start 820b. If a projected line from p1 with angle phi_UWA does not cross the immersion fluid supply system segment 840, the crossing point with (extended) line between backpoint start 830 and backpoint end 835 will determine u1.

A further exception is to account for secondary liquid loss; when liquid polygons from previous discrete movements (i.e. predicted liquid loss 860) are touching the immersion fluid supply system segments 840a, 840b at the start of a movement, a secondary liquid loss polygon 890 (see FIG. 16) is created.

This secondary liquid loss polygon 890 is created by a new p1 and another corner being determined by the position of corners touching the immersion fluid supply system at the start of the movement of the previous liquid loss polygon according to the uncontrolled wet area 880. As is shown in FIG. 16, a liquid loss area which corresponds to the UWA 880 is present at the start of the move of the immersion fluid supply system to the left. A new immersion fluid supply system wet move 850 is created. Because the liquid loss polygon 880 from the previous move is touching the immersion fluid supply system segment 840b at the start of the move, a secondary liquid loss polygon 890 is created. The rules relating to position of the other two corners and thereby the shape of the secondary liquid loss polygon 890 are described below with reference to FIG. 17. At the end of the process the secondary liquid loss polygon 890 is added to the predicted liquid loss 860 so that liquid predicted to be left behind is treated the same in whichever way it is assumed to have occurred.

Phi_UWA is the angle which determines the liquid loss area. In an embodiment, phi_UWA is a fixed value. In another embodiment, phi_UWA may be calculated by the model described below.

Figure 17:
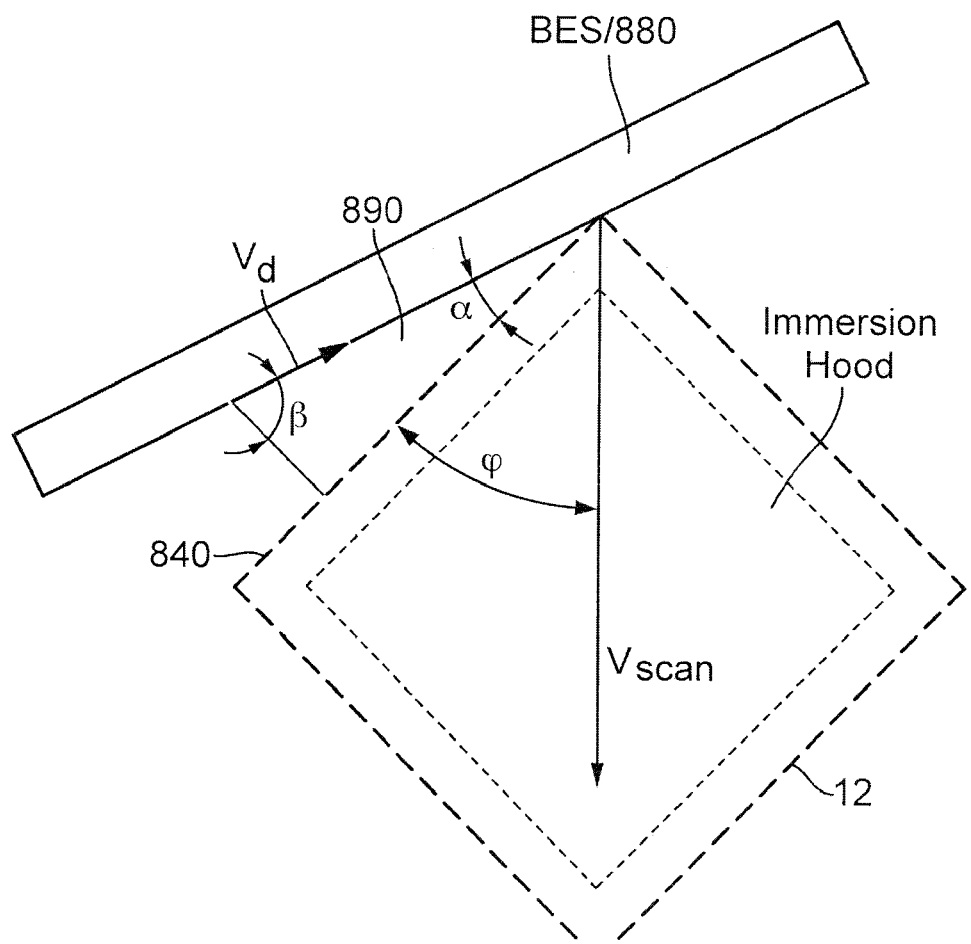
FIG. 17 is a representation of a goniometrical model describing the uncontrolled liquid loss area (UWA)

FIG. 17 illustrates how the shape of the UWA 880 or secondary liquid loss polygon 890 is calculated. With a straight bubble edge seal BES (gap between the edge of the substrate W and the substrate table WT) or edge of an UWA 880, the angle β can be computed using:

$$\beta = \arcsin\left(\frac{V_{scan}\sin\varphi}{V_d}\right) - \alpha \text{ for } V_{scan} \leq V_d/\sin\varphi$$

with φ the angle between the scan direction and the edge of the immersion fluid supply system footprint. In an embodiment of the model, this angle can be approximated by φ=45° when scanning in the optimal direction. α is the angle between the liquidphilic edge (BES) and the segment 840 and depends on the location where the substrate W edge is crossed. So, when φ=α=45°, which is a standard perpendicular BES crossing, the scan speed should be equal to $V_d$ to obtain β=0° and so no liquid loss. For TCX041, which is a commercial coating material with specific surface properties used to protect photo active material as a topcoat, the free running contact line velocity can be approximated at $V_d$=0.42 m/s. When perpendicularly crossing the BES gap at a scan speed of $V_{scan}$=0.6 m/s, the UWA 880 is spanned by β=45°. At higher scan speeds, the relation above no longer holds, meaning that the whole area behind the immersion fluid supply system will be a UWA 880 because the scan speed is above its critical value of losing liquid on the substrate, without crossing any pinning features.

The liquid loss model generally includes two functional parts: (i) liquid loss determination, and (ii) keeping track of remaining liquid and mopping properties of the immersion fluid supply system through the movement plan.

Figure 18:
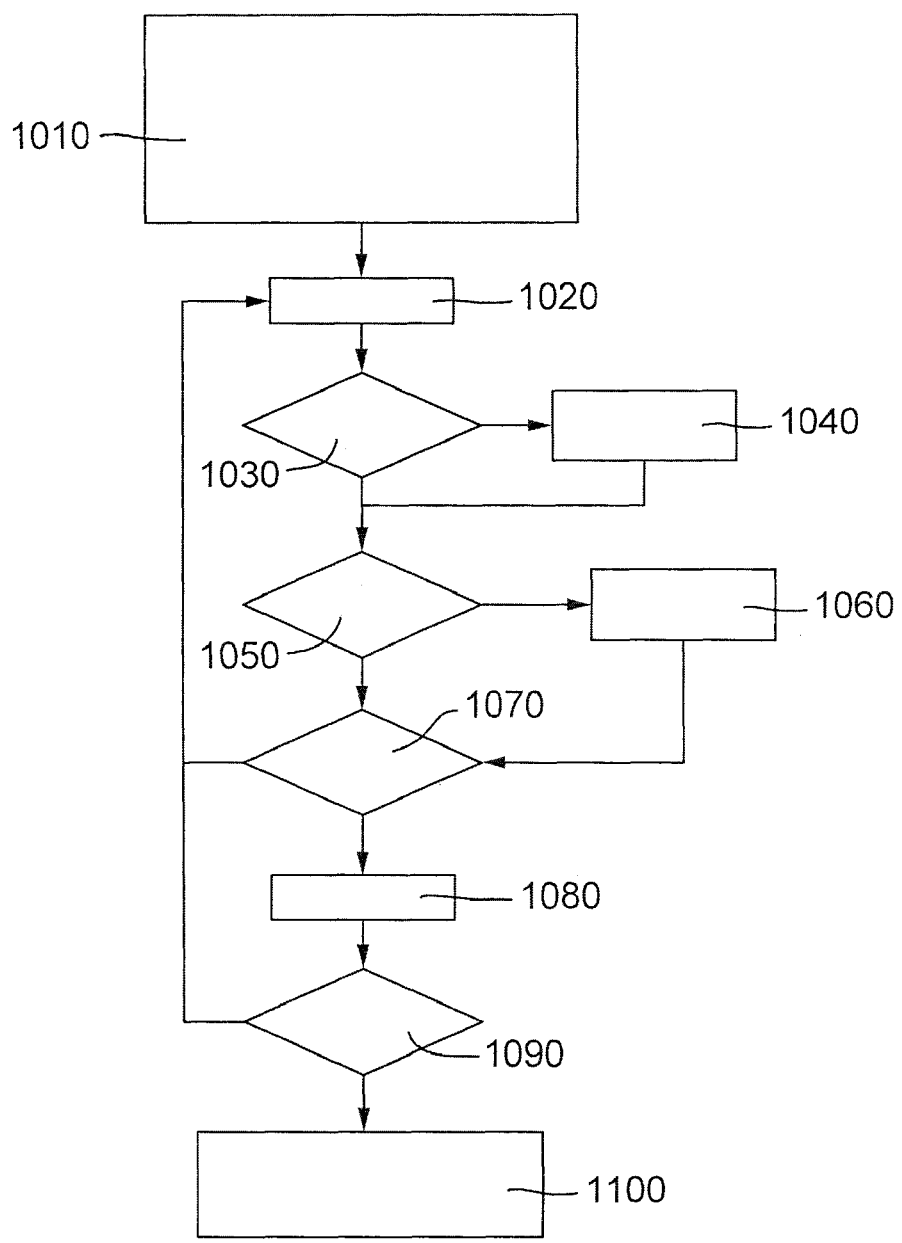
FIG. 18 is the general method of the liquid loss model, according to an embodiment of the invention.

In FIG. 18 the liquid loss model is displayed via a decision tree. The liquid loss determination itself is explained via a separate decision tree in FIG. 19. The inputs to the model at 1010 are the plurality of discrete movements (simplified meander), the scan and step coordinates and sequence and the dimensions of the immersion fluid supply system.

The model starts with the first move (N(+1)) (step 1020 in FIG. 18) and checks if liquid is present in the current field to be exposed (step 1030 in FIG. 18). When there is liquid present in the to-be exposed field and the move is a scan (not a step move), the liquid will be converted into gas and assumed to be (stored) as a bubble (BB) (i.e., an area with a bubble risk) (step 1040 in FIG. 18). Otherwise the model moves to step 1050. The model next checks if there is immersion fluid already present in the immersion fluid supply system wet move (step 1050 in FIG. 18), which will be removed from the substrate W because of the mopping function of the immersion fluid supply system (step 1060 in FIG. 18). That is, when the immersion fluid supply system encounters liquid on the substrate, it is assumed that the liquid on the substrate will be removed from the substrate by the immersion fluid supply system. Whether or not liquid remains on the substrate after passing of the immersion fluid supply system is calculated in step 1070 described below. If the discrete movement is a scanning movement then the liquid is already converted to bubbles (step 1040 described above). However, if the movement is a step movement, where no exposure takes place, the droplets are simply removed in step 1060. If there is no immersion fluid present, the model moves straight to step 1070. Step 1070 in FIG. 18 checks if the movement fulfills the liquid loss criteria described below. Step 1070 is the other functional part of the liquid loss model, which is described through another decision tree shown in FIG. 19. If there is no immersion fluid, the model moves straight back to step 1020 for the next discrete movement.

After the liquid loss model predicts liquid loss, the uncontrolled wet area (UWA) 880 may be created using a polygon function, explained above (step 1080 in FIG. 18). At this point, the first scan move of the meander is predicted and the next move, which is a step, will start by going to step 1020 still taking into account all predicted liquid and bubble (BB) areas of previous moves. The model ends when all the discrete movements of the full movement plan have been predicted (step 1090 in FIG. 18). Then at step 1100 liquid loss and bubble prediction polygons are outputted.

Step 1070 ("Does movement fulfill liquid loss criteria") of the method of FIG. 18 is illustrated in a separate decision tree (FIG. 19), and is discussed below.

The liquid loss determination model starts with some checks. The first check is if secondary liquid loss will take place, as described herein with reference to FIG. 16 (step 1210 in FIG. 19). If this is the case, all other checks will be skipped and immediately a liquid loss polygon will be created at step 1300. When no secondary liquid loss takes place the next check is if one or more immersion fluid supply system cornerpoints (i.e. corners of the immersion fluid supply system including the sidepoints and backpoints) at the start of the move are located (in plan) outside the substrate W (step 1220 in FIG. 19). If no cornerpoints are located outside the substrate the model moves to step 1230 and no liquid loss is deemed to have occurred.

Figure 19:
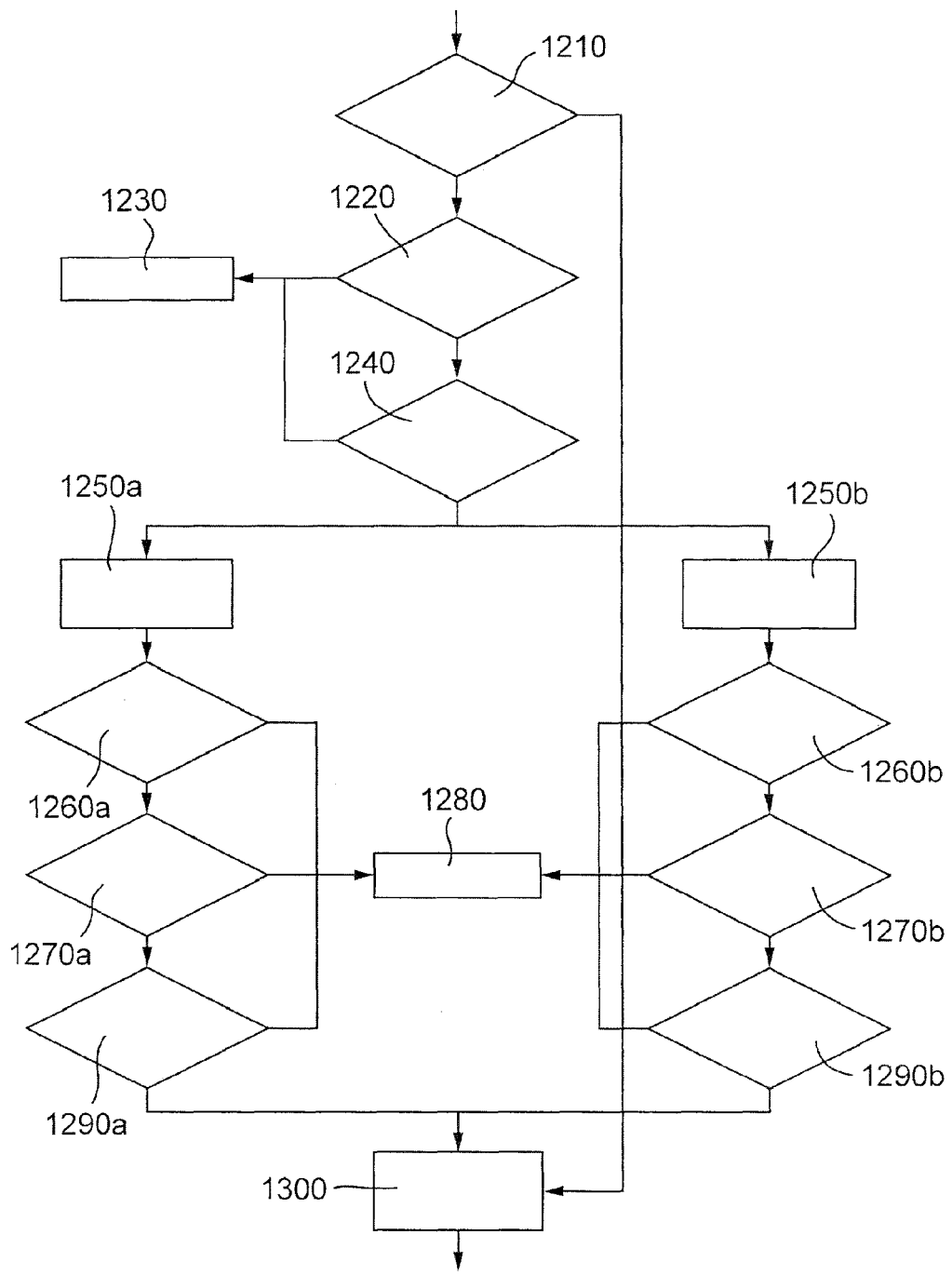
FIG. 19 is the general method for a portion of the liquid loss model of FIG. 18, according to an embodiment of the invention.

The next check is if the specific immersion fluid supply system movement is onto the substrate W (step 1240 in FIG. 19). If the movement is not onto the substrate W, then no liquid loss is predicted at step 1230. Each segment has calculations performed according to steps 1250, 1260, 1270 and 1290. When outcome of both checks (steps 1220, 1240) is positive, the liquid loss prediction will be calculated per immersion fluid supply system segment 840a, 840b (steps 1250a, b, 1260a, b, 1270a, b, 1290a, b in FIG. 19). First the segment is identified (step 1250). Again some checks will be performed. When both backpoint start 830 and sidepoint start 820 are inside the substrate W, no immersion fluid loss will take place (step 1260a, 1260b in FIG. 19) and step 1280 takes place determining no immersion fluid loss. The next two actions check if at the beginning of a BES-crossing move, the length of the receding immersion fluid supply system edge (i.e. the segment 840) that is outside the substrate W is less than 50% of the total length (of the segment 840), because in that case there is no liquid loss (step 1280). This is done by first calculating point p1, as described above, and then by checking if both, less then 50% of the vector from backpoint start 830 to p1 is located outside the substrate and if the sidepoint start 820 is inside the substrate (step 1270 in FIG. 19). If both are "yes," there is no immersion fluid loss and the model proceeds to step 1280, if no, the following action will check if both, more than 50% of the vector from backpoint start 830 to p1 is located outside the substrate W and if backpoint start 830 is inside the substrate W (step 1290 in FIG. 19). When the outcome again is no, the length of the segment 840 outside the substrate is larger than 50% of the segment 840 length, immersion fluid loss will take place and thus the liquid loss polygon will be created (step 1300 in FIG. 19), see above. If the answer is yes, step 1280 takes place and no immersion fluid loss is deemed to have occurred.

The following list is a summary of the decision and action boxes illustrated in FIG. 19:

1210 Will secondary liquid loss take place?
1220 Are >1 corner point(s) outside the substrate?
1240 Is the movement direction onto the substrate?
1250 Liquid loss predicted per segment
1260 Backpoint start or sidepoint start inside substrate radius?
1270 Distance backpoint start-p1<50% of total segment & sidepoint start inside substrate?
1290 Distance backpoint start-p1>50% of total segment & backpoint start inside substrate?
1300 Create liquid loss polygon (backpoint start-p1-u1-backpoint end)
  If p1 outside substrate: p1=sidepoint end 825
  If vector sidepoint start 820-sidepoint end 825 is outside substrate: p1=sidepoint end 825
  If vector sidepoint start 820-sidepoint end 825 is inside substrate: p1=substrate edge crossing position of vector backpoint start 830-sidepoint start 820

Figure 20:
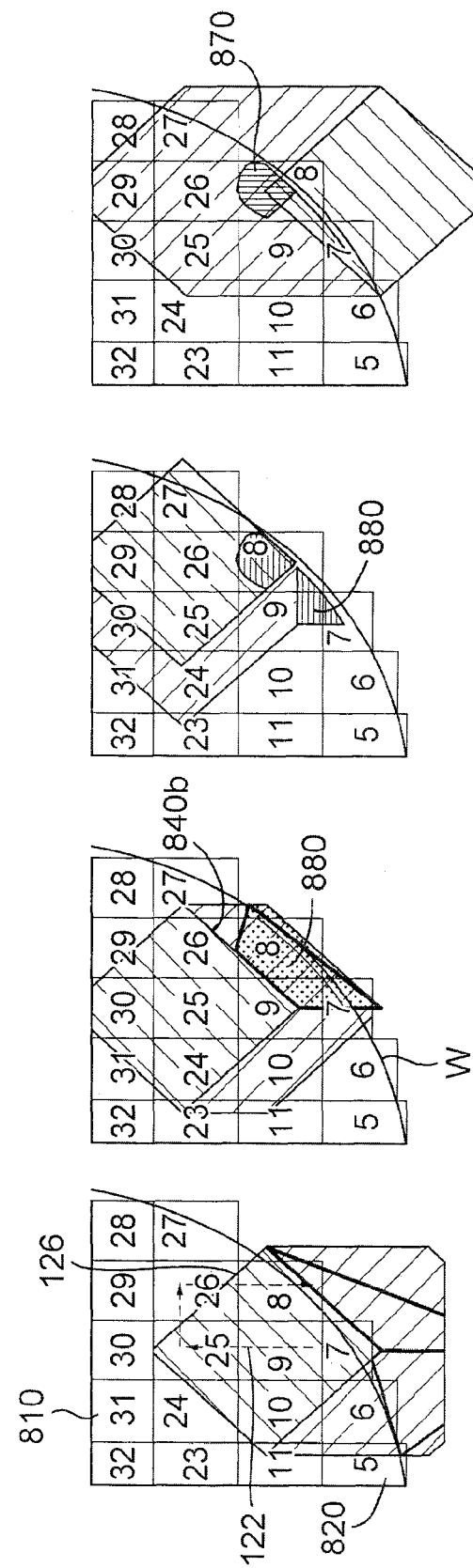
FIG. 20 illustrates a detailed example of bubble prediction, according to an embodiment of the invention.

In FIG. 20 a detailed example of the prediction of bubbles in a certain area in an example exposure layout is shown.

The bubble risk (BR) and liquid risk (LR) are calculated per step and scan move in the movement plan based on the predicted liquid and bubble (BB) polygons.

FIG. 20 shows four positions of the immersion fluid supply system (i) following scanning exposure of field 7, (ii) following Manhattan step up for preparation of scanning of field 8, (iii) following Manhattan step to the left for preparation of exposure of field 8 and (iv) following exposure of field 8 respectively. Unexposed fields 810 and exposed fields 820 are illustrated. An area of bubble risk in field 6 is indicated. Following the first Manhattan step, it can be seen that uncontrolled liquid loss (UWA 880) has occurred as the edge of the substrate W passes under the segment 840b of the immersion fluid supply system. During the step to the left some of the uncontrolled liquid loss (UWA 880) is mopped up (steps 1050 and 1060 in FIG. 18) by movement of the immersion fluid supply system. During scanning of field 8, when the substrate W moves up as drawn relative to the immersion fluid supply system, a potential area with a high risk of bubbles is indicated in the bottom left of field 8 (steps 1030 and 1040 in FIG. 18). This area is the result of the immersion fluid supply system becomes located over an area with liquid on it (left over from the first Manhattan step). The bubbles are produced by collision of the meniscus extending between the substrate and the immersion fluid supply system with the immersion fluid left behind on the substrate W. A further area in the top central portion of field 8 is identified as an area of potential bubble risk. This is because liquid was identified as being present there (even though it has been mopped up). That therefore indicates a possible region of bubbles due to previous liquid loss.

As can be seen, if liquid loss during the Manhattan step upwards in FIG. 20 was prevented, bubbles during scanning of field 8 would not be predicted. Therefore, one way of adjusting the movement plan would be to reduce the speed of the Manhattan step upwards such that liquid loss would not occur or occur less. The Manhattan step to the left could occur at normal speed as could the scan.

Figure 21:
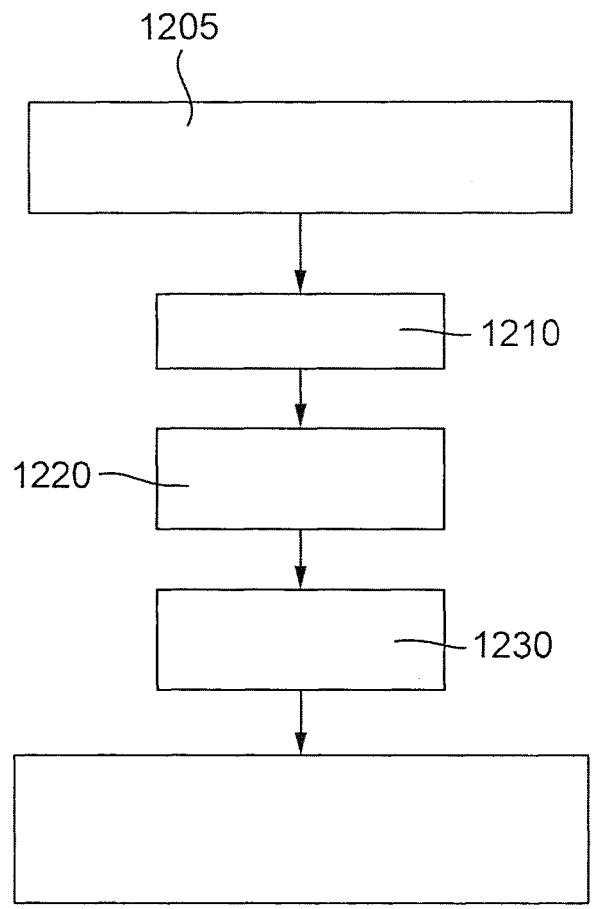
FIG. 21 is a decision tree to calculate bubble risk and liquid risk, according to an embodiment of the invention.

The different actions used to calculate the bubble risk (BR) and liquid risk (LR) are shown in FIG. 21. The model receives inputs at 1205 of the liquid loss and bubble polygons which are calculated in accordance with that described above and particularly as illustrated graphically in FIG. 20. The model first calculates at step 1210 the area of each polygon separately (both liquid loss and BB) and then the total polygon area (liquid loss and BB separately) in step 1220. Then the BR and LR are calculated in step 1230. The BR and LR are taken to be proportional to the area of the respective polygon. The results are stored in step 1240 with the corresponding discrete movement in a table.

The alternative speed belonging to a certain value of BR/LR may be determined. This is done by converting the model output BR/LR, as calculated in the previous section, to an alternative speed. The risk to speed converter allows matching of actual performance to predicted performance, thus allowing to correct for differences between prediction and reality. Corresponding alternative speeds are specified and added to the BR and LR table. The alternative speeds are calculated via a risk to alternative speed conversion table which is a machine constant.

Liquid loss on markers/sensors due to the meander can be predicted and movement may be slowed down for improved machine reliability. This is done by avoiding immersion fluid droplets being present on markers/sensors used during substrate table WT alignment.

Figure 22:
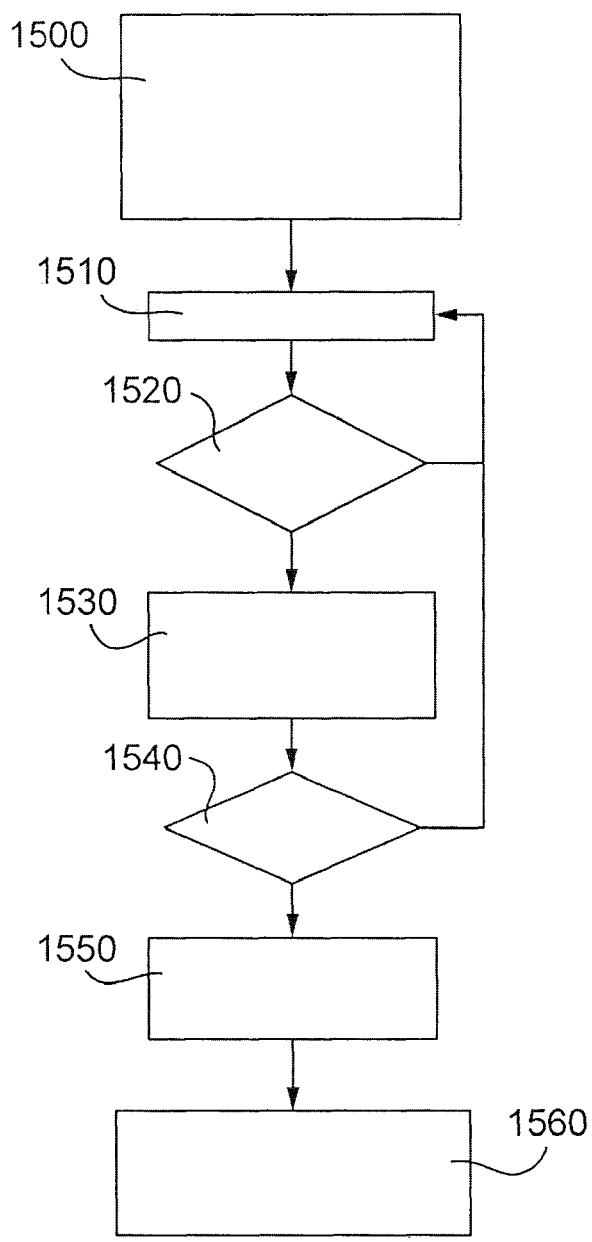
FIG. 22 is a decision tree of the TIS liquid loss model, according to an embodiment of the invention.

In FIG. 22, the marker/sensor liquid loss model is shown in a decision tree.

The marker/sensor liquid loss model runs together with the liquid loss prediction model. It starts with the scan move of the first exposure meander field and works through the movement plan until the end of the meander is reached. For each move the model checks if one or more of the defined marker/sensor locations (e.g. six) are located inside the immersion fluid supply system wet move. If this is the case, the specific move is stored together with the specific marker/sensor in a table. When the end of the meander is reached, per marker/sensor the last immersion fluid supply system wet move (Nmax) is calculated and stored together with all other wet moves in a table to the belonging marker/sensor.

The method/model can be used to predict liquid loss on marker/sensors that are wetted during execution of a movement plan. If a step/scan will be done at full speed, it can result in immersion fluid remaining on these markers/sensors, which in turn impacts performance/reliability of the apparatus. The basic idea is to extend the method to predict liquid loss on markers/sensors due to exposure movements. Based on the liquid loss prediction, steps/scans will be slowed down to reduce, or even avoid, liquid loss on markers/sensors, which may result in better performance and reliability.

At step 1500 the same input as at step 700 is provided. The model starts with the scan move (N(+1)) of the first exposure meander field (step 1510 in FIG. 22) and checks if a sensor/marker is in the immersion fluid supply system wet move in step 1520. If the answer is no, then the process moves back to step 1510. If there is a marker/sensor in the immersion fluid supply system wet move, the process moves to step 1530 where that specific wet move is stored in a table together with the marker/sensor which is wet. At step 1540 the process returns to step 1510 if the final discrete movement of the movement plan has not been reached. If the final discrete movement of the movement plan has been reached, the model moves to step 1550 at which the last discrete movement which wets each marker/sensor is determined. An output 1560 is provided which lists all discrete movements which leave each marker/sensor wet and also lists the last discrete movements of the movement plan which leave each marker/sensor wet.

The method can be used when other features pass under the projection system for example during crossing of a surface and approaching an edge of the surface such as approaching the gap between the substrate table and a bridge or sensor. Other surfaces where an embodiment of the invention could be used include surfaces which are likely to be lyophilic surfaces or at least have portions which are a reduced contact angle, such as a sensor. Because other features passing under the projection system can result in instability of the meniscus, in one embodiment the controller may adjust the one or more operating conditions of the apparatus when the motion is close to a feature, such as a sensor. For sensors, such as a lens interferometer (e.g., an ILIAS), or a transmission image sensor (TIS), or a spot sensor, a gas knife of the liquid confinement structure 12 could be turned off or have its flow rate reduced in order to avoid liquid loss on the lyophilic part of any of those sensors.

Therefore, as can be seen, an embodiment of the present invention can be implemented in many types of immersion lithographic apparatus. In an embodiment the lithographic apparatus may comprise a sensor to detect fluid leaked from the immersion fluid supply system or to detect a bubble of a size greater than a certain size being present in the immersion fluid or the immersion fluid supply system. A comparator may be used to compare the results of the detection with the results of the position and/or risk determining steps. In this way the model may be improved. In particular, the calculation of lost liquid and bubble formation may be improved.

The description herein discloses a way in which the presence or absence of bubbles and the possibility of imaging errors from bubbles can be predicted. Other ways of predicting liquid loss and the possibility of resulting bubbles following collisions with the meniscus extending between the immersion fluid supply system and the substrate are possible. For example, a full physical model calculating the interactions between various pinning points (e.g. the edge of the substrate or an object supported by a table) and the meniscus could be calculated. Alternatively or additionally, a model could be totally empirically based, i.e. based on observations of the conditions under which leaking and/or bubbles form.

In an aspect, there is provided a method of adjusting speed and/or routing of a part of a movement plan of a table under an immersion fluid supply system of a lithographic apparatus, the method comprising: a splitting step for splitting the movement plan of the table into a plurality of discrete movements; a risk determining step for determining for a certain of the plurality of discrete movements a risk of a bubble of a size greater than a certain size being present in immersion fluid of the immersion fluid supply system through which a patterned beam of the lithographic apparatus will pass during the certain discrete movement by determining whether the immersion fluid supply system passes over a position at which immersion fluid leaked from the immersion fluid supply system is present; and an adjusting step for (i) adjusting the speed and/or routing of a part of the movement plan corresponding to at least one discrete movement earlier than a discrete movement for which the risk determining step determines a risk of a bubble, and/or (ii) adjusting the speed and/or routing of a part of the movement plan corresponding to a discrete movement for which the risk determining step determines a risk of a bubble. In an embodiment, the method further comprises a position determining step for determining for the certain discrete movement the position of immersion fluid leaked from the immersion fluid supply system, wherein the result of the position determining step is used in the risk determining step. In an embodiment, the position determining step determines for the certain discrete movement whether immersion fluid will leak from the immersion fluid supply system during the certain discrete movement. In an embodiment, the position determining step determines whether immersion fluid will leak from the immersion fluid supply system by using an empirical model of leaking behavior of the immersion fluid supply system. In an embodiment, the position determining step determines whether immersion fluid will leak from the immersion fluid supply system by determining whether an edge of the immersion fluid supply system passes over a meniscus pinning feature on the table. In an embodiment, the meniscus pinning feature comprises an edge of an object supported by the table, for example the edge of a substrate or a sensor. In an embodiment, the position determining step determines whether immersion fluid will leak from the immersion fluid supply system by determining whether an edge of the immersion fluid supply system passes onto an object on the table during the certain discrete movement. In an embodiment, the position determining step determines whether immersion fluid will leak from the immersion fluid supply system by determining whether a length of portion of the edge of the immersion fluid supply system outside the object at the end of the certain discrete movement is more than a certain percentage of the whole length of the edge. In an embodiment, the position determining step determines whether immersion fluid will leak from the immersion fluid supply system by determining whether the position determining step for the discrete movement preceding the certain discrete movement resulted in a determination of an immersion fluid leak from the immersion fluid supply system. In an embodiment, the position determining step determines whether immersion fluid will leak from the immersion fluid supply system by using a physical model of interaction of immersion fluid from the immersion fluid supply system with the immersion fluid supply system and the table and any objects on the table. In an embodiment, in the position determining step, any positions over which the immersion fluid supply system completely passes are determined to be free of immersion fluid determined by the position determining step to have leaked from the immersion fluid supply system during an earlier discrete movement than the certain discrete movement. In an embodiment, the position determining, risk determining and adjusting steps are each carried out one after the other for a given discrete movement of the plurality of discrete movements before the position determining, risk determining and adjusting steps are each carried out one after the other for another discrete movement of the plurality of discrete movements which immediately follows the given discrete movement. In an embodiment, the risk determining step determines a risk of a bubble of a size greater than a certain size being present in immersion fluid of the immersion fluid supply system through which a patterned beam of the lithographic apparatus will pass during the certain discrete movement by determining whether the position of immersion fluid leaked from the immersion fluid supply system is a position which is to be illuminated by the patterned beam during the certain discrete movement. In an embodiment, the adjusting step reduces the speed and/or routing of a part of the movement plan corresponding to at least one discrete movement earlier than the certain discrete movement for which the risk determining step determines a risk of a bubble to avoid immersion fluid loss during the at least one discrete movement such that the position of immersion fluid leaked from the immersion fluid supply system would not result in a risk of a bubble of a size greater than a certain size being present in immersion fluid of the immersion fluid supply system through which a patterned beam of the lithographic apparatus will pass during the certain discrete movement. In an embodiment, the adjusting step reduces the speed of a part of the movement plan corresponding to the certain discrete movement for which the risk determining step determines a risk of a bubble to avoid the formation of bubbles of a size greater than the certain size on collision of the immersion fluid leaked from the immersion fluid supply system with immersion fluid in the immersion fluid supply system. In an embodiment, the splitting step splits the movement plan into stepping movements and scanning movements. In an embodiment, the method further comprises, during the risk determining step, determining whether immersion fluid leaked from the immersion fluid supply system onto a position corresponding to a marker on the table. In an embodiment, the adjusting step is for (i) adjusting the speed and/or routing of a part of the movement plan corresponding to at least one discrete movement earlier than a discrete movement for which the risk determining step determines that fluid leaked onto a position corresponding to a marker or sensor, and/or (ii) adjusting the speed and/or routing of a part of the movement plan corresponding to a discrete movement for which the risk determining step determines that fluid leaked onto a position corresponding to a marker or sensor.

In an aspect, there is provided a method of operating a lithographic apparatus, the method comprising: moving a table relative to a projection system configured to project a patterned beam of radiation though immersion fluid provided by an immersion fluid supply system on to a target portion of an object on the table according to movement plan adjusted according to a method described herein. In an embodiment, the method further comprises using a sensor to detect immersion fluid leaked from the immersion fluid supply system or to detect a bubble of a size greater than a certain size being present in immersion fluid of the immersion fluid supply system through which a patterned beam of the lithographic apparatus will pass during the certain discrete movement and comparing the results of the detection with the results of the position and/or risk determining steps.

In an aspect, there is provided an immersion lithographic apparatus comprising: a substrate table configured to support a substrate; a projection system configured to direct a patterned beam of radiation on to a substrate; a immersion fluid supply system configured to supply and confine immersion fluid to a space defined between the projection system and the substrate, or the substrate table, or both; a positioning system configured to determine the relative position of the substrate, or the substrate table, or both, relative to the immersion fluid supply system, or the projection system, or both; and a controller constructed and arranged to control a table according to a movement plan, wherein the controller is configured to adjust speed and/or routing of the movement plan by splitting the movement plan into a plurality of discrete movements, determining for a certain of the plurality of discrete movements a risk of a bubble of a size greater than a certain size being present in immersion fluid of the immersion fluid supply system through which a patterned beam of the lithographic apparatus will pass during the certain discrete movement by determining whether the immersion fluid supply system passes over a position at which immersion fluid leaked from the immersion fluid supply system is present, and adjusting (i) the speed and/or routing of a part of the movement plan corresponding to at least one discrete movement earlier than a discrete movement for which the determining determines a risk of a bubble, and/or (ii) the speed and/or routing of a part of the movement plan corresponding to a discrete movement for which the determining determines a risk of a bubble. In an embodiment, the apparatus further comprises a sensor configured to detect immersion fluid leaked from the immersion fluid supply system or to detect a bubble of a size greater than a certain size being present in immersion fluid of the immersion fluid supply system through which a patterned beam of the lithographic apparatus will pass during the certain discrete movement. In an embodiment, the apparatus comprises a comparator configured to compare the results of the detection with the results of the determining.

In an aspect, there is provided a method of adjusting speed and/or routing of a part of a movement plan of a table under an immersion fluid supply system of a lithographic apparatus, the method comprising: splitting the movement plan of the table into a plurality of discrete movements; determining, for a certain of the plurality of discrete movements, a risk of a bubble of a size greater than a certain size being present in immersion fluid of the immersion fluid supply system through which a patterned beam of the lithographic apparatus will pass during the certain discrete movement by determining whether the immersion fluid supply system passes over a position at which immersion fluid leaked from the immersion fluid supply system is present; and adjusting (i) the speed and/or routing of a part of the movement plan corresponding to at least one discrete movement earlier than a discrete movement for which the risk determining step determines a risk of a bubble, and/or (ii) the speed and/or routing of a part of the movement plan corresponding to a discrete movement for which the risk determining step determines a risk of a bubble. In an embodiment, the method further comprises determining, for the certain discrete movements, the position of immersion fluid leaked from the immersion fluid supply system, wherein the result of the position determining is used in the risk determining.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

What is claimed is:

1. A method of adjusting speed and/or routing of at least a part of a movement plan of a table under an immersion fluid supply system of a lithographic apparatus, the method comprising:
   determining, for a certain discrete movement of a plurality of discrete movements of the movement plan, a value of one or more parameters characterizing a risk of a bubble of a size greater than a certain non-zero size being present in immersion fluid through which a patterned beam of the lithographic apparatus will pass by determining that a position, at which immersion fluid leaked from the immersion fluid supply system is present, travels under immersion fluid contained by the immersion fluid supply system and by determining that a position, at which immersion fluid leaked from the immersion fluid supply system is present, does not travel under immersion fluid contained by the immersion fluid supply system; and
   based on the value of the one or more parameters, adjusting (i) the speed and/or routing of a part of the movement plan corresponding to a discrete movement earlier than a discrete movement for which the risk of a bubble is determined, and/or (ii) the speed and/or routing of a part of the movement plan corresponding to a discrete movement for which the risk of a bubble is determined.

2. The method of claim 1, further comprising determining, for the certain discrete movement, the position of immersion fluid leaked from the immersion fluid supply system and wherein the determined position is used in determining the value of the one or more parameters.

3. The method of claim 2, wherein determining the position comprises determining, for the certain discrete movement, whether immersion fluid will leak from the immersion fluid supply system during the certain discrete movement.

4. The method of claim 3, wherein determining the position comprises determining whether immersion fluid will leak from the immersion fluid supply system by determining whether a meniscus pinning feature on the table travels under an edge of the immersion fluid supply system.

5. The method of claim 4, wherein the meniscus pinning feature comprises an edge of an object supported by the table.

6. The method of claim 5, wherein determining the position comprises determining whether immersion fluid will leak from the immersion fluid supply system by determining whether a length of portion of the edge of the immersion fluid supply system located over a position outside the object at the end of the certain discrete movement is more than a certain percentage of the whole length of the edge.

7. The method of claim 4, wherein determining the position comprises determining whether immersion fluid will leak from the immersion fluid supply system by determining whether an edge of the immersion fluid supply system transitions from being located over a position off the object to being located over a position on the object on the table during the certain discrete movement.

8. The method of claim 2, wherein determining the position comprises determining whether immersion fluid will leak from the immersion fluid supply system by using an empirical model of leaking behavior of the immersion fluid supply system.

9. The method of claim 8, wherein determining the position comprises determining whether immersion fluid will leak from the immersion fluid supply system by determining whether determining the position of immersion fluid leaked from the immersion fluid supply system for a discrete movement preceding the certain discrete movement resulted in a determination of an immersion fluid leak from the immersion fluid supply system.

10. The method of claim 2, wherein determining the position comprises determining whether immersion fluid will leak from the immersion fluid supply system by using a model of the physical behavior of immersion fluid from the immersion fluid supply system with the immersion fluid supply system and the table and any objects on the table.

11. The method of claim 2, wherein, in the position determining, any positions completely traveling under the immersion fluid supply system are determined to be free of immersion fluid determined by the position determining to have leaked from the immersion fluid supply system during an earlier discrete movement than the certain discrete movement.

12. The method of claim 2, wherein the determining the position, the determining the value of the one or more parameters, and the adjusting are each carried out one after the other for a given discrete movement of the plurality of discrete movements before the determining the position, determining the value of the one or more parameters, and the adjusting are each carried out one after the other for another discrete movement of the plurality of discrete movements which immediately follows the given discrete movement.

13. The method of claim 1, wherein the determining the value of the one or more parameters comprises determining whether the position of immersion fluid leaked from the immersion fluid supply system is a position which is to be illuminated by the patterned beam during the certain discrete movement.

14. The method of claim 1, wherein the adjusting comprising reducing the speed and/or routing of a part of the movement plan corresponding to a discrete movement earlier than the certain discrete movement for which the risk of a bubble is determined to avoid immersion fluid loss during the at least one discrete movement such that the position of immersion fluid leaked from the immersion fluid supply system would not result in a risk of a bubble of a size greater than a certain size being present in immersion fluid through which a patterned beam of the lithographic apparatus will pass during the certain discrete movement.

15. The method of claim 1, wherein the adjusting comprises reducing the speed of a part of the movement plan corresponding to the certain discrete movement for which the risk of a bubble is determined to avoid the formation of a bubble of a size greater than a certain size on collision of the immersion fluid leaked from the immersion fluid supply system with immersion fluid in the immersion fluid supply system.

16. The method of claim 1, further comprising splitting the movement plan into stepping movements and scanning movements.

17. The method of claim 1, further comprising, during the determining the value of the one or more parameters, determining whether immersion fluid leaked from the immersion fluid supply system onto a position corresponding to a marker on the table.

18. The method of claim 17, wherein the adjusting comprising adjusting (i) the speed and/or routing of a part of the movement plan corresponding to a discrete movement earlier than a discrete movement for which it is determined that fluid leaked onto a position corresponding to the marker, and/or (ii) adjusting the speed and/or routing of a part of the movement plan corresponding to a discrete movement for which it is determined that fluid leaked onto a position corresponding to the marker.

19. An immersion lithographic apparatus comprising:
a substrate table configured to support a substrate;
a projection system configured to direct a patterned beam of radiation onto a substrate;
an immersion fluid supply system configured to supply and confine immersion fluid to a space defined between the projection system and the substrate, or the substrate table, or both;
a positioning system configured to control a relative position between (i) the substrate, or the substrate table, or both, and (ii) the immersion fluid supply system, or the projection system, or both; and
a controller constructed and arranged to control a table according to a movement plan and configured to adjust speed and/or routing of at least part of the movement plan by determining, for a certain discrete movement of a plurality of discrete movements of the movement plan, a risk of a bubble of a size greater than a certain non-zero size being present in immersion fluid through which a patterned beam of the lithographic apparatus will pass by determining that a position, at which immersion fluid leaked from the immersion fluid supply system is present, travels under immersion fluid contained by the immersion fluid supply system and by determining that a position, at which immersion fluid leaked from the immersion fluid supply system is present, does not travel under immersion fluid contained by the immersion fluid supply system, and adjusting (i) the speed and/or routing of a part of the movement plan corresponding to a discrete movement earlier than a discrete movement for which the risk of a bubble is determined, and/or (ii) the speed and/or routing of a part of the movement plan corresponding to a discrete movement for which the risk of a bubble is determined.

20. The apparatus of claim 19, further comprising a sensor configured to detect immersion fluid leaked from the immersion fluid supply system or to detect a bubble of a size greater than a certain size being present in immersion fluid of the immersion fluid supply system through which a patterned beam of the lithographic apparatus will pass during the certain discrete movement.

21. An immersion lithographic apparatus comprising:
a substrate table configured to support a substrate;
a projection system configured to direct a patterned beam of radiation onto a substrate;
an immersion fluid supply system configured to supply and confine immersion fluid to a space defined between the projection system and the substrate, or the substrate table, or both;
a positioning system configured to control a relative position between (i) the substrate, or the substrate table, or both, and (ii) the immersion fluid supply system, or the projection system, or both; and a control system constructed and arranged to control a table according to a movement plan, the control system configured to:

determine, for a certain discrete movement of a plurality of discrete movements of the movement plan, a first risk of a bubble of a size greater than a certain non-zero size being present in immersion fluid through which a patterned beam of the lithographic apparatus will pass during the certain discrete movement by determining that a position, at which immersion fluid leaked from the immersion fluid supply system is present, travels under the immersion fluid supply system;

determine, for another certain discrete movement of the plurality of movements of the movement plan, a second risk, lower than the first risk, of a bubble of a size greater than a certain non-zero size being present in immersion fluid through which a patterned beam of the lithographic apparatus will pass during the other discrete movement by determining that a position, at which immersion fluid leaked from the immersion fluid supply system is present, travels under the immersion fluid supply system; and based on the first risk and/or second risk, adjusting (i) the speed and/or routing of a part of the movement plan corresponding to a discrete movement earlier than a discrete movement for which the respective first risk and/or second risk of a bubble is determined, and/or (ii) the speed and/or routing of a part of the movement plan corresponding to a discrete movement for which the respective first risk and/or second risk of a bubble is determined.

\* \* \* \* \*